United States Patent
Kuzumoto et al.

(10) Patent No.: US 10,400,162 B2
(45) Date of Patent: Sep. 3, 2019

(54) PHOSPHOR CONTAINING PARTICLE, AND LIGHT EMITTING DEVICE AND PHOSPHOR CONTAINING SHEET USING THE SAME

(71) Applicant: Sharp Kabushiki Kaisha, Sakai, Osaka (JP)

(72) Inventors: Yasutaka Kuzumoto, Sakai (JP); Tatsuya Ryohwa, Sakai (JP); Mami Morishita, Sakai (JP); Noriyuki Yamazumi, Sakai (JP); Makoto Izumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/968,910

(22) Filed: May 2, 2018

(65) Prior Publication Data

US 2018/0251677 A1 Sep. 6, 2018

Related U.S. Application Data

(62) Division of application No. 15/375,219, filed on Dec. 12, 2016, now abandoned.

(30) Foreign Application Priority Data

Dec. 15, 2015 (JP) .................... 2015-244210
Dec. 15, 2015 (JP) .................... 2015-244211

(51) Int. Cl.
*H01L 33/50* (2010.01)
*C09K 11/02* (2006.01)
(Continued)

(52) U.S. Cl.
CPC .......... *C09K 11/025* (2013.01); *C09K 11/703* (2013.01); *H01L 33/501* (2013.01);
(Continued)

(58) Field of Classification Search
CPC .......... H01L 33/60; H01L 33/38; H01L 33/54; H01L 33/58; H01L 33/501; H01L 33/502;
(Continued)

(56) References Cited

U.S. PATENT DOCUMENTS

2010/0044640 A1 2/2010 Agrawal et al.
2013/0189803 A1 7/2013 Nasaani et al.

FOREIGN PATENT DOCUMENTS

CN 104066814 A 9/2014
WO 2015/187490 A1 12/2015

OTHER PUBLICATIONS

Kuzumoto et al., "Phosphor containing particle, and light emitting device and phosphor containing sheet using the same", U.S. Appl. No. 15/375,219, filed Dec. 12, 2016.

*Primary Examiner* — Tucker J Wright
(74) *Attorney, Agent, or Firm* — Keating & Bennett, LLP

(57) ABSTRACT

A phosphor containing particle includes a semiconductor nanoparticle phosphor and a matrix including a constitutional unit derived from an ionic liquid, the semiconductor nanoparticle phosphor being dispersed in the matrix. A light emitting device comprises a light source and a wavelength converter in which the phosphor containing particle of the present invention is dispersed in a translucent medium. A phosphor containing sheet in which the phosphor containing particle of the present invention is dispersed in a sheet-like translucent medium.

32 Claims, 11 Drawing Sheets

(51) Int. Cl.
*C09K 11/70* (2006.01)
*B82Y 20/00* (2011.01)

(52) U.S. Cl.
CPC ............ *H01L 33/502* (2013.01); *B82Y 20/00* (2013.01); *H01L 33/504* (2013.01); *H01L 2224/48091* (2013.01); *H01L 2924/181* (2013.01); *Y10S 977/774* (2013.01); *Y10S 977/95* (2013.01)

(58) Field of Classification Search
CPC ... H01L 33/504; C09K 11/025; C09K 11/703; B82Y 20/00; Y10S 977/774
See application file for complete search history.

PHOSPHOR CONTAINING PARTICLE, AND LIGHT EMITTING DEVICE AND PHOSPHOR CONTAINING SHEET USING THE SAME

This nonprovisional application is based on Japanese Patent Application Nos. 2015-244210 and 2015-244211 filed on Dec. 15, 2015, with the Japan Patent Office, the entire contents of which are hereby incorporated by reference.

BACKGROUND OF THE INVENTION

1. Field of the Invention

The present invention relates to a phosphor containing particle, and a light emitting device and a phosphor containing sheet using the same.

2. Description of the Related Art

It is known that a semiconductor nanoparticle phosphor (also referred to as a quantum dot) reduced in size to approximately an exciton Bohr-radius presents a quantum size effect. A quantum size effect is that when a substance is reduced in size, an electron therein is unable to move freely and the electron's energy is only able to assume a specific value rather than any value. Furthermore, it is also known that as the semiconductor nanoparticle phosphor which confines an electron therein varies in size, the electron's energy state also varies, and the semiconductor nanoparticle phosphor emits light having a wavelength which is shorter as the semiconductor nanoparticle phosphor is reduced in dimension.

Such a semiconductor nanoparticle phosphor is of commercial interest for an electron characteristic size-tuneable by the quantum size effect. The size-tuneable electron characteristic is able to be used in a variety of applications such as biological labeling, photovoltaic power generation, catalysis, biological image pick-up, LED, general space lighting, and an electron emission display.

Semiconductor nanoparticle phosphor has a large specific surface area and a high surface activity, and accordingly, it chemically and physically less easily stabilizes. Accordingly, a method for stabilizing a semiconductor nanoparticle phosphor has been proposed.

For example, Japanese National Patent Publication No. 2013-505347 discloses a plurality of coated primary particles such that each primary particle includes a primary matrix material and a group of semiconductor nanoparticles, each primary particle is individually provided with a layer of a surface coating material, the primary particle has a microbead structure, and the surface coating material includes a polymeric material. A plurality of primary particles thus coated is able to reduce reactivity to a surrounding environment and a process performed after the primary particles are produced.

However, a conventional art disclosed in Japanese National Patent Publication No. 2013-505347 uses resins such as epoxy, silicone and (meth)acrylate, silica, etc. as the primary matrix material. When a semiconductor nanoparticle phosphor is directly blended with a sealing material such as silicone and acrylate, the semiconductor nanoparticle phosphor agglomerates and accordingly, has an impaired optical characteristic or is similarly degraded, and after the semiconductor nanoparticle phosphor is sealed, oxygen passes through the sealing material and moves to a surface of the semiconductor nanoparticle phosphor, and thus causes photooxidation, resulting in a reduced quantum yield.

In order to solve such a problem, Japanese National Patent Publication No. 2013-505347 proposes a method in which a plurality of semiconductor nanoparticle phosphors are previously held in a matrix material such as polymer and glass and the intermediate product has a surface coated to produce a primary particle which is in turn buried in a host LED material such as silicone and acrylate (see Japanese National Patent Publication No. 2013-505347, FIG. 8). This method, however, still has a problem, i.e., the primary particle's matrix material is similar to the host LED material, and accordingly, in producing the primary particle the semiconductor nanoparticle phosphor agglomerates resulting in an impaired optical characteristic.

SUMMARY OF INVENTION

Preferred embodiments of the present invention provide a phosphor containing particle producible while preventing degradation of a semiconductor nanoparticle phosphor by agglomeration, and a light emitting device and a phosphor containing sheet using the same.

The technique described in Japanese National Patent Publication No. 2013-505347 uses resins such as epoxy, silicone and (meth)acrylate, silica, etc. as a translucent medium and when a semiconductor nanoparticle phosphor is incorporated thereinto the semiconductor nanoparticle phosphor will degrade. In view of this, the present inventors have found that a matrix including a constitutional unit derived from an ionic liquid is able to be used as a translucent medium dispersing the semiconductor nanoparticle phosphor so that when a particle is produced the semiconductor nanoparticle phosphor does not degrade and is thereafter also able to present excellent stability against photooxidation, and the present inventors have thus completed the present invention. More specifically, the present invention is as follows:

A phosphor containing particle according to a preferred embodiment of the present invention is characterized by including a semiconductor nanoparticle phosphor and a matrix including a constitutional unit derived from an ionic liquid, the semiconductor nanoparticle phosphor being dispersed in the matrix.

The matrix used in the phosphor containing particle according to various preferred embodiments of the present invention includes a resin derived from the ionic liquid. The ionic liquid used in the phosphor containing particle according to various preferred embodiments of the present invention includes a polymerizable functional group.

According to the present invention, by providing a semiconductor nanoparticle phosphor in the form of a particle dispersed in a matrix including a constitutional unit derived from an ionic liquid (i.e., a phosphor containing particle), such particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced. Thus a phosphor containing particle is able to be provided which has high light emission efficiency and excellent chemical stability, and is also excellent in handleability. Furthermore, the thus obtained phosphor containing particle, when produced in a size approximately the same as a currently used phosphor, is able to be used in a form similar to that of a currently commercially used phosphor, and a light emitting device and a phosphor containing sheet, etc. using the same are able to be provided.

The phosphor containing particle according to a preferred embodiment of the present invention has a particle size within a range of about 100 nm to about 30 μm.

The semiconductor nanoparticle phosphor according to a preferred embodiment of the present invention may include a single type of semiconductor nanoparticle phosphor or may include a red fluorescent light emitting semiconductor nanoparticle phosphor and a green fluorescent light emitting semiconductor nanoparticle phosphor.

The resin used in the phosphor containing particle according to various preferred embodiments of the present invention is crosslinked.

The phosphor containing particle according to a preferred embodiment of the present invention has an outermost surface including a translucent coating layer. In that case, a material included in the coating layer is preferably an inorganic material having a band gap equal to or greater than 3.0 eV.

The phosphor containing particle according to a preferred embodiment of the present invention may include a support to seal the matrix. In that case, preferably, the support includes silica.

In the phosphor containing particle according to a preferred embodiment of the present invention, the semiconductor nanoparticle phosphor may have a surface including a polar functional group.

Furthermore, in the present invention, preferably, the support has a hollow capsular structure having pores penetrating from a wall surface into an internal space, or a globular structure having pores extending from a surface inwards.

The present invention also provides a light emitting device comprising a light source and a wavelength converter in which the phosphor containing particle according to preferred embodiments of the present invention as described above is dispersed in a translucent medium.

The light emitting device according to a preferred embodiment of the present invention may include a phosphor containing particle in which a red fluorescent light emitting semiconductor nanoparticle phosphor is dispersed in a resin including a constitutional unit derived from an ionic liquid including a polymerizable functional group, and a phosphor containing particle in which a green fluorescent light emitting semiconductor nanoparticle phosphor is dispersed in a resin including a constitutional unit derived from an ionic liquid including a polymerizable functional group.

In the light emitting device according to a preferred embodiment of the present invention, other than the phosphor containing particle, a phosphor other than the semiconductor nanoparticle phosphor may further be dispersed in the medium.

The present invention also provides a phosphor containing sheet in which the phosphor containing particle according to a preferred embodiment of the present invention described above is dispersed in a sheet-like translucent medium.

The phosphor containing sheet according to a preferred embodiment of the present invention may include a phosphor containing particle in which a red fluorescent light emitting semiconductor nanoparticle phosphor is dispersed in a resin including a constitutional unit derived from an ionic liquid including a polymerizable functional group, and a phosphor containing particle in which a green fluorescent light emitting semiconductor nanoparticle phosphor is dispersed in a resin including a constitutional unit derived from an ionic liquid including a polymerizable functional group.

In the phosphor containing sheet according to a preferred embodiment of the present invention, a phosphor other than the semiconductor nanoparticle phosphor may further be dispersed in the medium.

The above and other elements, features, steps, characteristics and advantages of the present invention will become more apparent from the following detailed description of the preferred embodiments with reference to the attached drawings.

DESCRIPTION OF THE PREFERRED EMBODIMENTS

<Phosphor Containing Particle>

(Phosphor Containing Particle According to a First Embodiment)

Figure 1:
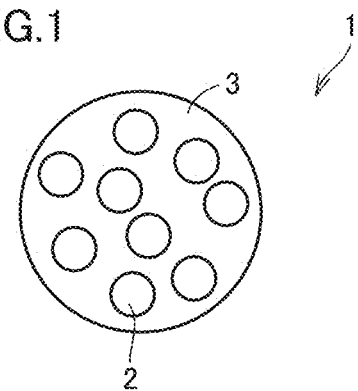
FIG. 1 schematically shows a phosphor containing particle 1 according to a first embodiment of the present invention.

FIG. 1 schematically shows a phosphor containing particle (a nanoparticle phosphor element/a microbead) 1 according to a first embodiment of the present invention. Phosphor containing particle 1 according to a preferred embodiment of the present invention is characterized by including a semiconductor nanoparticle phosphor 2 and a matrix 3 including a constitutional unit derived from an ionic liquid, semiconductor nanoparticle phosphor 2 being dispersed in matrix 3.

The "ionic liquid" used according to preferred embodiments of the present invention is preferably a salt in a molten state even at an ambient temperature (e.g., about 25 degrees centigrade) (ambient temperature molten salt) which is preferably expressed in a general formula (I) below:

$$X^+Y^- \quad (I).$$

In the general formula (I), $X^+$ is a cation selected from among imidazolium ion, pyridinium ion, phosphonium ion, aliphatic quaternary ammonium ion, pyrrolidinium, and sulfonium. Among these, aliphatic quaternary ammonium ion is a particularly preferred cation as it is excellently stable thermally and against air and moisture in the atmosphere.

Furthermore, in the general formula (I), $Y^-$ is an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion. Among these, bis trifluoromethyl sulfonyl imide acid ion is a particularly preferred anion as it is excellently stable thermally and against air and moisture in the atmosphere.

Matrix 3 includes a constitutional unit derived from an ionic liquid, and specifically, it may include an ionic liquid or a resin including a constitutional unit derived from an ionic liquid including a polymerizable functional group. Matrix 3 may include another component as long as matrix 3 includes an ionic liquid or a resin including a constitutional unit derived from an ionic liquid including a polymerizable functional group as a major component (e.g., by 80 mass % or more).

The ionic liquid is able to be an ionic liquid including a polymerizable functional group or an ionic liquid excluding a polymerizable functional group. The ionic liquid excluding a polymerizable functional group for example includes N,N,N-trimethyl-N-propyl ammonium bis(trifluoromethane sulfonyl) imide, N,N-dimethyl-N-methyl-2-(2-methoxy ethyl) ammonium bis(trifluoromethane sulfonyl)imide (DEME), and the like.

The ionic liquid used in phosphor containing particle 1 according to various preferred embodiments of the present invention includes a polymerizable functional group. By including the ionic liquid including the polymerizable functional group, the ionic liquid functioning as a dispersion medium for the semiconductor nanoparticle phosphor is able to be polymerized as it is in the presence of the polymerizable functional group. Thus, by providing the resin including the constitutional unit derived from the ionic liquid including the polymerizable functional group by polymerizing the ionic liquid including the polymerizable functional group with the semiconductor nanoparticle phosphor being dispersed, agglomeration which has occurred in solidification of the resin in which the semiconductor nanoparticle phosphor has been dispersed is significantly reduced or prevented. Furthermore, as described above, the semiconductor nanoparticle phosphor is dispersed in the resin including the constitutional unit derived from the ionic liquid including the polymerizable functional group, so that the semiconductor nanoparticle phosphor is electrostatically stabilized, the semiconductor nanoparticle phosphor is reliably and securely protected, the surface of the semiconductor nanoparticle phosphor is protected against the effects of air and moisture, and a light emitting device high in efficiency in light emission is realized.

The polymerizable functional group of the ionic liquid is not particularly restricted. For polymerization by heating or catalyst reaction, a (meth)acrylic acid ester group (a (meth) acryloyloxy group) is preferred because the semiconductor nanoparticle phosphor is able to be solidified with a dispersed state being maintained from a state of a liquid in which stable dispersion is achieved.

To achieve excellent stability against air and moisture in the atmosphere, suitable examples of the ionic liquid including such a (meth)acrylic acid ester group include 2-(methacryloyloxy)-ethyltrimethylammonium bis(trifluoromethanesulfonyl) imide (MOE-200T) shown in a formula below:

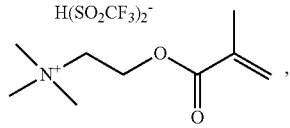

and 1-(3-acryloyloxy-propyl)-3-methylimidazolium bis(trifluoromethanesulfonyl) imide shown in a formula below:

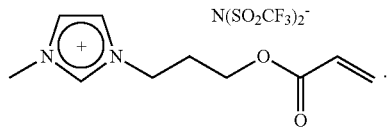

The ionic liquid including the polymerizable functional group as described above is able to be obtained by introducing a polymerizable functional group into a conventionally known appropriate ionic liquid with a conventionally known appropriate method, however, a commercially available product may naturally be used.

Suitable conditions in accordance with a type or an amount of an ionic liquid including a polymerizable functional group to be used are selected as appropriate as conditions for a temperature and a time period for polymerization of the ionic liquid including the polymerizable functional group while the semiconductor nanoparticle phosphor is dispersed, and the conditions are not particularly restricted. For example, when 2-(methacryloyloxy)-ethyltrimethylammonium bis(trifluoromethanesulfonyl) imide may preferably be used as the ionic liquid including the polymerizable functional group, polymerization is able to suitably be achieved, for example, under a condition of a temperature from 60 to 100 degrees centigrade for 1 to 10 hours. When 1-(3-acryloyloxy-propyl)-3-methylimidazoliumethyltrimethylammonium bis(trifluoromethanesulfonyl)imide is used as the ionic liquid including the polymerizable functional group, polymerization is able to be suitably achieved, for example, under a condition of a temperature from about 60 degrees centigrade to about 150 degrees centigrade for about 1 hour to about 10 hours.

When a catalyst is used in polymerization, a catalyst to be used is not particularly restricted, and for example, conventionally known azobisisobutyronitrile or dimethyl 2,2'-azobis(2-methylpropionate) is able to be used. Of these, for rapid progress of polymerization, azobisisobutyronitrile is preferably used as a catalyst.

Semiconductor nanoparticle phosphor 2 in phosphor containing particle 1 according to a preferred embodiment of the present invention is a single phosphor particles without scattering of visible light, and a conventionally known appropriate semiconductor nanoparticle phosphor is able to be used without being particularly restricted. By using the semiconductor nanoparticle phosphor, advantageously, an emission wavelength is able to be precisely controlled based on control of particle size and control of composition.

Figure 2:
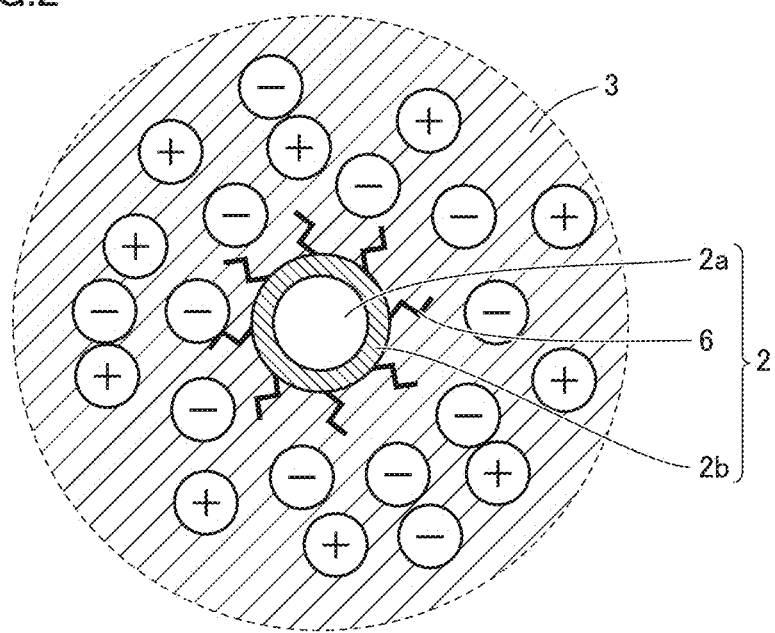
FIG. 2 is a cross section of phosphor containing particle 1 shown in FIG. 1 such that it is partially enlarged.

FIG. 2 is a cross section of phosphor containing particle 1 shown in FIG. 1 such that it is partially enlarged. As shown in FIG. 2, semiconductor nanoparticle phosphor 2 includes a nanoparticle core 2a including a compound semiconductor, a shell layer 2b covering nanoparticle core 2a, and an organic modifying group 6 bonded to an external surface of shell layer 2b. Preferably, organic modifying group 6 includes a polar functional group.

Nanoparticle core 2a includes a compound semiconductor. The compound semiconductor included in nanoparticle core 2a has a composition such as InN, InP, InAs, InSb, InBi, InGaN, InGaP, GaP, AlInN, AlInP, AlGaInN, AlGaInP, CdS, CdSe, CdTe, CdZnS, CdZnSe, CdZnTe, CdZnSSe, CdZnSeTe, $In_2S_3$, $In_2Se_3$, $Ga_2Se_3$, $In_2Te_3$, $Ga_2Te_3$, $CuInS_2$, $CuInSe_2$, $CuInTe_2$ for example. The compound semiconductor having such a composition has a bandgap energy which emits visible light of a wavelength of about 380 nm to about 780 nm. Accordingly, by controlling particles' diameter and mixed crystal ratio, a nanoparticle core which is able to emit any visible light is able to be formed.

Nanoparticle core 2a preferably includes a semiconductor of InP, GaP, or CdSe. This is because InP, GaP, and CdSe are composed of a small number of materials and thus easily produced, and in addition, they are materials which present high quantum yields, and present high light emission efficiency when irradiated with LED light. Note that quantum yield as referred to herein is a ratio of the number of photons emitting light as fluorescence relative to the number of absorbed photons.

Shell layer 2b includes a compound semiconductor formed succeeding a crystal structure of nanoparticle core 2a. Shell layer 2b is a layer formed by growing a semiconductor crystal on a surface of nanoparticle core 2a, and nanoparticle core 2a and shell layer 2b are bonded by a chemical bond. Preferably, shell layer 2b is at least one selected from the group consisting of GaAs, GaP, GaN, GaSb, InAs, InP, InN, InSb, AlAs, AlP, AlSb, AlN, ZnO, ZnS, ZnSe, ZnTe, CdS, CdSe, CdTe, CdZnS, CdZnSe, CdZnTe, CdZnSSe, CdZnSeTe, $In_2O_3$, $Ga_2O_3$, $In_2S_3$, $Ga_2S_3$, and $ZrO_2$, for example. Preferably shell layer 2b has a thickness of about 0.1 nm to about 10 nm. Furthermore, shell layer 2b may have a multilayer structure including a plurality of shell layers.

Furthermore, as a material other than the above used to form the semiconductor nanoparticle phosphor, AlS, APbS, PbSe, Si, Ge, MgS, MgSe, MgTe, etc. are also included.

Furthermore, the semiconductor nanoparticle phosphor may be a two-component core type, three-component core type, four-component core type, core-shell type or core multishell type, doped or slanted semiconductor nanoparticle phosphor known to those skilled in the art. FIG. 1 shows a plurality of semiconductor nanoparticle phosphors of a single type dispersed in a resin including a constitutional unit derived from an ionic liquid including a polymerizable functional group.

Shell layer 2b has an external surface bonded to organic modifying group 6. Organic modifying group 6 is formed by causing a modifying organic compound to react to bond to the external surface of shell layer 2b. Thus, a dangling bond of a surface of shell layer 2b is capped by organic modifying group 6 and a surface defect of shell layer 2b is significantly reduced or prevented, and nanoparticle core 2a is thus improved in light emission efficiency.

Semiconductor nanoparticle phosphor 2 that has a surface with organic modifying group 6 is able to prevent semiconductor nanoparticle phosphors 2 from agglomerating together. This helps to disperse the semiconductor nanoparticle phosphor in matrix 3 including a constitutional unit derived from an ionic liquid.

Preferably, the modifying organic compound has a polar functional group at a terminal thereof. When the modifying organic compound is caused to react with the external surface of shell layer 2b, the polar functional group is disposed on a surface of semiconductor nanoparticle phosphor 2. Thus, semiconductor nanoparticle phosphor 2 has a surface having a polarity, and semiconductor nanoparticle phosphor 2 is thus able to disperse in matrix 3 including a constitutional unit derived from an ionic liquid.

Examples of the polar functional group include a carboxyl group, a hydroxyl group, a thiol group, a cyano group, a nitro group, an ammonium group, an imidazolium group, a sulfonium group, a pyridinium group, a pyrrolidinium group, a phosphonium group, and the like.

Preferably, the polar functional group in the modifying organic compound is an ionic functional group. The ionic functional group is high in polarity, and the semiconductor nanoparticle phosphor having a surface with the ionic functional group is significantly excellent in dispersibility in a matrix including a constitutional unit derived from an ionic liquid. Furthermore, when the semiconductor nanoparticle phosphor is sealed in a matrix including a constitutional unit derived from an ionic liquid, an electrostatic effect by the ionic liquid's positive and negative charges significantly enhances the semiconductor nanoparticle phosphor's stability. The ionic liquid will be described later.

Examples of the ionic functional group include an ammonium group, an imidazolium group, a sulfonium group, a pyridinium group, a pyrrolidinium group, a phosphonium group, and the like.

The modifying organic compound's remaining structure is not particularly limited as long as it has a polar functional group at a terminal thereof. Specifically, dimethylaminoethanethiol, carboxydecanethiol, n-trimethoxysilyl butanoic acid (TMSBA) 3-aminopropyldimethylethoxysilane (APDMES), 3-aminopropyltrimethoxysilane (APTMS), N-trimethoxysilylpropyl-N, N, N-trimethyl ammonium chloride (TMSP-TMA), 3-(2-aminoethylamino)propyltrimethoxysilane (AEAPTMS), 2-cyanoethyltriethoxysilane, and the like are able to be used.

The semiconductor nanoparticle phosphor may be a single type thereof or two or more types thereof in combination.

The shape of the semiconductor nanoparticle phosphor is not particularly restricted and a semiconductor nanoparticle phosphor including a conventionally known appropriate shape such as a globular shape, a rod shape, or a wire shape, for example, is able to be used without particularly being restricted. In particular, from a point of view of ease in control of light emission characteristics based on control of shape, a globular semiconductor nanoparticle phosphor is preferably used, for example.

The particle size of the semiconductor nanoparticle phosphor is able to be selected as appropriate in accordance with a source material and a desired emission wavelength, without being particularly restricted, however, it is preferably within a range from about 1 nm to about 20 nm and more preferably within a range from about 2 nm to about 5 nm, for example. When the semiconductor nanoparticle phosphor has a particle size smaller than about 1 nm, a ratio of a surface area to a volume tends to increase, a surface defect tends to be dominant, and an effect tends to be lowered. When the semiconductor nanoparticle phosphor has a particle size exceeding about 20 nm, a state of dispersion tends to be low and agglomeration and settling tend to occur. When the semiconductor nanoparticle phosphor has a globular shape, the particle size refers, for example, to an average particle size measured with a particle size distribution analyzer or to a size of a particle observed with an electron microscope. When the semiconductor nanoparticle phosphor has a rod shape, the particle size refers, for example, to a length of a minor axis and a major axis measured with an electron microscope. When the semiconductor nanoparticle phosphor has a wire shape, the particle size refers, for example, to a length of a minor axis and a major axis measured with an electron microscope.

Though the content of the semiconductor nanoparticle phosphor (or a total amount thereof when two or more types of semiconductor nanoparticle phosphors are used as will be described later) is not particularly restricted, the content is preferably within a range from about 0.001 to about 50 parts by weight and more preferably within a range from about 0.01 to about 20 parts by weight, for example, with respect to 100 parts by weight of the ionic liquid including the polymerizable functional group. When the content of the semiconductor nanoparticle phosphor is smaller than about 0.001 part by weight with respect to 100 parts by weight of the ionic liquid including the polymerizable functional group, light emission from the semiconductor nanoparticle phosphor tends to be excessively weak. When the content of the semiconductor nanoparticle phosphor exceeds about 50 parts by weight with respect to 100 parts by weight of the ionic liquid including the polymerizable functional group, uniform dispersion in the ionic liquid including the polymerizable functional group tends to be difficult.

Figure 3:
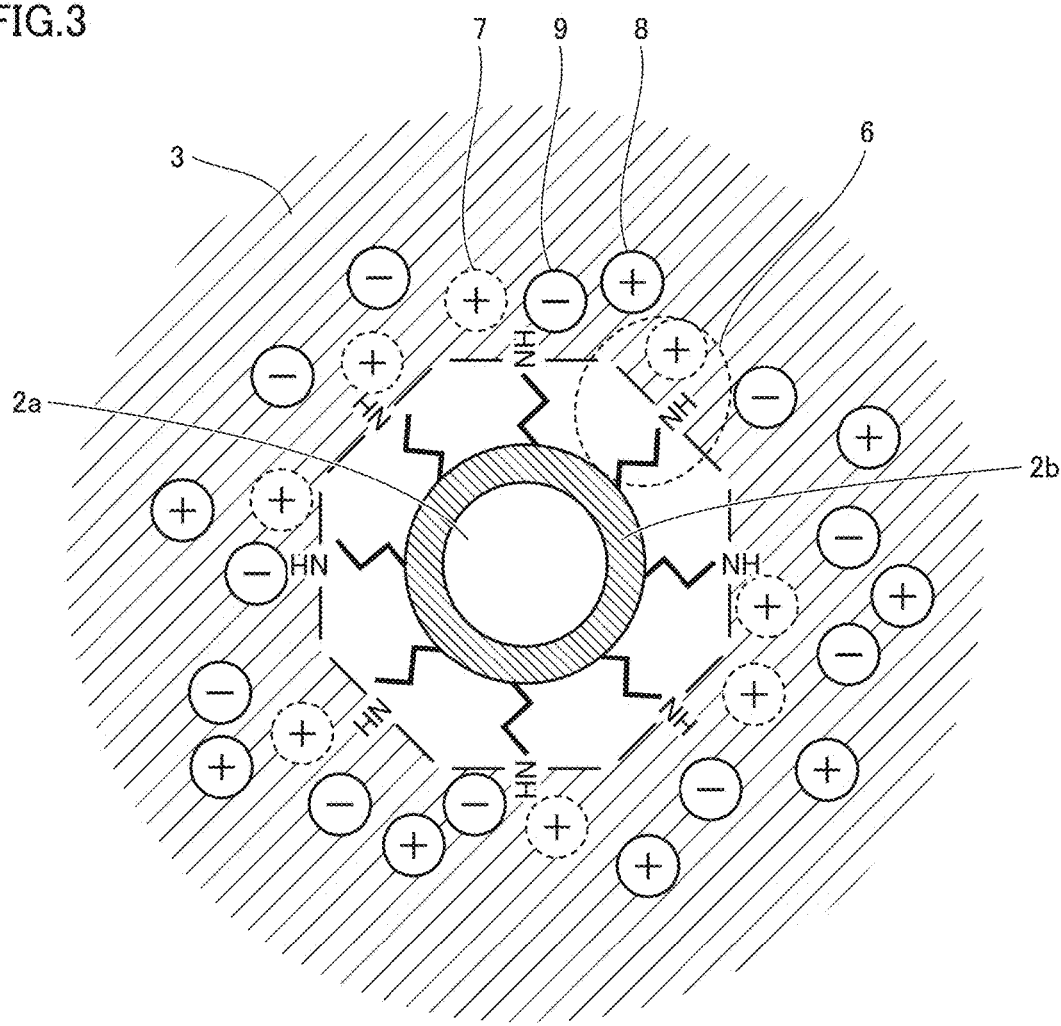
FIG. 3 is a cross section of phosphor containing particle 1 shown in FIG. 1 such that it is partially enlarged.

Hereinafter reference will be made to FIG. 3 to specially describe an effect obtained by dispersing semiconductor nanoparticle phosphor 2 in matrix 3 including a constitutional unit derived from an ionic liquid.

Semiconductor nanoparticle phosphor 2 in matrix 3 is able to be satisfactorily dispersed in matrix 3 by an electrostatic effect of a positive charge 8 and a negative charge 9 attributed to the ionic liquid in matrix 3.

Furthermore, the electrostatic effect attributed to the ionic liquid in matrix 3 stabilizes organic modifying group 6 of the surface of the semiconductor nanoparticle phosphor and significantly reduces or prevents a dangling bond caused by separation of organic modifying group 6 from the surface of the semiconductor nanoparticle phosphor, and is thus able to prevent the semiconductor nanoparticle phosphor from having a reduced quantum yield.

Inter alia, when organic modifying group 6 includes a polar functional group, an ionic functional group, etc. and the functional groups are present on a surface of the semiconductor nanoparticle phosphor, an electrostatic interaction between electric charge 7 included in these functional groups and positive charge 8 and negative charge 9 derived from the ionic liquid further enhances the semiconductor nanoparticle phosphor's stability.

Thus, the phosphor containing particle according to a preferred embodiment of the present invention has an ion that configures an ionic liquid coordinated on a surface of the semiconductor nanoparticle phosphor to stabilize nanoparticles and thus allows high light emission efficiency. Furthermore, as the semiconductor nanoparticle phosphor is dispersed in a matrix including a constitutional unit derived from an ionic liquid including a polymerizable functional group which has a low oxygen and moisture permeability, particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced. Thus, when the semiconductor nanoparticle phosphor is excited and thus caused to emit light, it is less likely to be photooxidized and thus has an excellent chemical stability.

The matrix including the constitutional unit derived from the ionic liquid including the polymerizable functional group with the semiconductor nanoparticle phosphor dispersed therein (a polymer matrix) may be formed into particles in any method, however, the polymer matrix is able to be physically crushed to have a desired size to suitably produce the particles.

The phosphor containing particle according to preferred embodiments of the present invention may have conventionally known appropriate shapes such as a globe, a rod and a wire, however, preferably it is globular, spherical in particular, in terms of easiness in controlling a light emission characteristic by controlling a shape.

The phosphor containing particle according to preferred embodiments of the present invention is not particularly limited in particle size, however, a range of about 50 nm to about 2 mm is preferable, a range of about 100 nm to about 30 μm is more preferable, and a range of about 1 μm to about 20 μm is particularly preferable. This is because when the phosphor containing particle has a particle size less than 100 nm, the phosphor containing particle will have a large surface area/volume ratio per particle and has a tendency to have a large loss due to scattering of excitation light, whereas when the phosphor containing particle has a particle size exceeding 30 μm, it has a tendency to be difficult to disperse in a translucent medium through a process similar to that for a conventional phosphor. The phosphor containing particle having a particle size within the above range is good in handleability, and by producing it in a size approximately the same as a currently used phosphor, it is able to be used in a form similar to that of a currently commercially used phosphor without changing a currently used process, and a light emitting device and a phosphor containing sheet, etc. using the same are able to be provided. Note that the phosphor containing particle's particle size indicates a size of the particle as observed with an optical microscope or a scanning electron microscope (SEM), or a value as measured with a particle size distribution measurement device.

(Phosphor Containing Particle According to a Second Embodiment)

Figure 4:
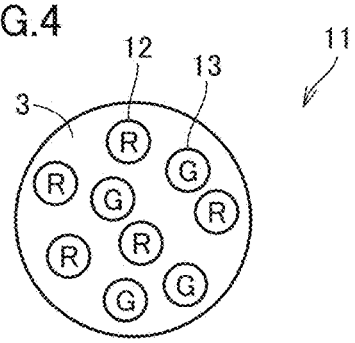
FIG. 4 schematically shows a phosphor containing particle 11 according to a second embodiment of the present invention.

FIG. 4 schematically shows a phosphor containing particle (a nanoparticle phosphor element/a microbead) 11 according to a second embodiment of the present invention. Note that in FIG. 4, any portion having a configuration similar to that of phosphor containing particle 1 according to the first embodiment shown in FIG. 1 is identically denoted and will not be described.

Phosphor containing particle 11 according to the second embodiment shown in FIG. 4 includes a semiconductor nanoparticle phosphor including a red fluorescent light emitting semiconductor nanoparticle phosphor 12 and a green fluorescent light emitting semiconductor nanoparticle phosphor 13. Phosphor containing particle 1 according to the first embodiment shown in FIG. 1 includes semiconductor nanoparticle phosphor 2 of only a single type and thus having a single fluorescent wavelength, whereas phosphor containing particle 11 according to the second embodiment shown in FIG. 4 includes a plurality of semiconductor nanoparticle phosphors of a type having a fluorescent wavelength and a plurality of semiconductor nanoparticle phosphors of a different type having a different fluorescent wavelength. When such a phosphor containing particle is used in combination with such a light emitting element as described later to produce a light emitting device, such devices are able to be less likely to have individual variation. Furthermore, a phosphor containing particle is able to be obtained which is able to emit light having a color improved in uniformity across the entire region. Note that while FIG. 4 shows a case where a plurality of red fluorescent light emitting semiconductor nanoparticle phosphors and a plurality of green fluorescent light emitting semiconductor nanoparticle phosphors for a total of two types of semiconductor nanoparticle phosphors are used, still another type of semiconductor nanoparticle phosphor may be included and thus three or more types of semiconductor nanoparticle phosphors may be included.

The semiconductor nanoparticle phosphor's content (or a total amount thereof when two or more types of semiconductor nanoparticle phosphors are used) is not particularly limited, however, it is preferably within a range of 0.001 to 50 parts by weight relative to 100 parts by weight of the ionic liquid including the polymerizable functional group, more preferably within a range of 0.01 to 20 parts by weight. This is because when the semiconductor nanoparticle phosphor's content is less than 0.001 parts by weight relative to 100 parts by weight of the ionic liquid including the polymerizable functional group, light emission from the semiconductor nanoparticle phosphor has a tendency to be too week, whereas when the semiconductor nanoparticle phosphor's content exceeds 50 parts by weight relative to 100 parts by weight of the ionic liquid including the polymerizable functional group, the semiconductor nanoparticle phosphor has tendency to be difficult to disperse uniformly in the ionic liquid including the polymerizable functional group.

Furthermore, while in phosphor containing particle 11 in the second embodiment shown in FIG. 4 the mixing ratio of the red fluorescent light emitting semiconductor nanoparticle phosphor and the green fluorescent light emitting semiconductor nanoparticle phosphor is not particularly limited, in a weight ratio the green fluorescent light emitting semiconductor nanoparticle phosphor is preferably within a range from about 10 to about 1000 and more preferably within a range from about 20 to about 500, with the red fluorescent light emitting semiconductor nanoparticle phosphor being defined as 100. When a weight ratio of the green fluorescent light emitting semiconductor nanoparticle phosphor is lower than about 10 with the red fluorescent light emitting semiconductor nanoparticle phosphor being defined as 100, a color of light emission tends to significantly deviate from white and to be closer to red due to a difference in light emission intensity between red and green. When the weight ratio of the green fluorescent light emitting semiconductor nanoparticle phosphor exceeds 1000 with the red fluorescent light emitting semiconductor nanoparticle phosphor being defined as 100, a color of light emission tends to significantly deviate from white and to be closer to green due to a difference in light emission intensity between red and green.

(Phosphor Containing Particle According to a Third Embodiment)

Figure 5:
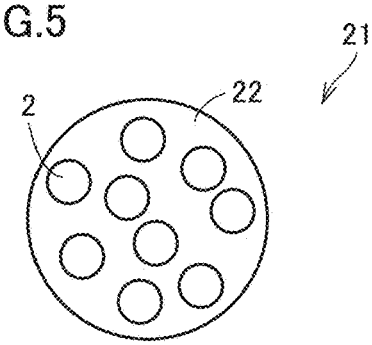
FIG. 5 schematically shows a phosphor containing particle 21 according to a third embodiment of the present invention.

FIG. 5 schematically shows a phosphor containing particle (a nanoparticle phosphor element/a microbead) 21 according to a third embodiment of the present invention. Note that in FIG. 5, any portion having a configuration similar to that of phosphor containing particle 1 according to the first embodiment shown in FIG. 1 is identically denoted and will not be described. Phosphor containing particle 21 according to the third embodiment shown in FIG. 5 is different from phosphor containing particle 1 according to the first embodiment shown in FIG. 1 in that a resin 22 is crosslinked (i.e., the resin in phosphor containing particle 1 according to the first embodiment shown in FIG. 1 is not crosslinked). In other words, the resin in the phosphor containing particle according to the third embodiment shown in FIG. 5 is derived from an ionic liquid including a polymerizable functional group, that has a cross-linking agent added thereto. By using resin 22 derived from an ionic liquid including a polymerizable functional group, that has a cross-linking agent added thereto, when the ionic liquid including the polymerizable functional group is polymerized, stronger solidification is able to be achieved and the wavelength converter's stability is able to be advantageously improved. Note that, that resin 22 is crosslinked is able to be confirmed by measurement by X-ray photoelectron spectroscopy (XPS).

While the cross-linking agent may be a conventionally known, appropriate cross-linking agent and is not particularly limited, examples of the cross-linking agent include diethyleneglycol dimethacrylate and 1,1,1-trimethylol propane triacrylate. Of these, for such a reason that there are many cross-linking sites and secure polymerization is achieved, 1,1,1-trimethylol propane triacrylate is preferably used as the cross-linking agent.

When the cross-linking agent is added, an amount of addition is not particularly restricted either, however, an amount of addition is preferably within a range from 1 to 50 parts by weight and more preferably within a range from 1 to 30 parts by weight with respect to 100 parts by weight of the ionic liquid including the polymerizable functional group. When an amount of addition of the cross-linking agent is smaller than 1 part by weight with respect to 100 parts by weight of the ionic liquid including the polymerizable functional group, a cross-linking structure does not tend to develop and strength of the resin tends to be weak. When an amount of addition of the cross-linking agent exceeds 50 parts by weight with respect to 100 parts by weight of the ionic liquid including the polymerizable functional group, the semiconductor nanoparticle phosphor does not tend to be dispersed in a stable manner.

Note that while FIG. 5 shows a case where, as well as in FIG. 1, a plurality of semiconductor nanoparticle phosphors of a single type are used, in place of this, as has been shown in FIG. 4, a plurality of red fluorescent light emitting semiconductor nanoparticle phosphors and a plurality of green fluorescent light emitting semiconductor nanoparticle phosphors for a total of two types of semiconductor nanoparticle phosphors may be used, or still another type of semiconductor nanoparticle phosphor may be included and thus three or more types of semiconductor nanoparticle phosphors may be included.

(Phosphor Containing Particle According to a Fourth Embodiment)

Figure 6:
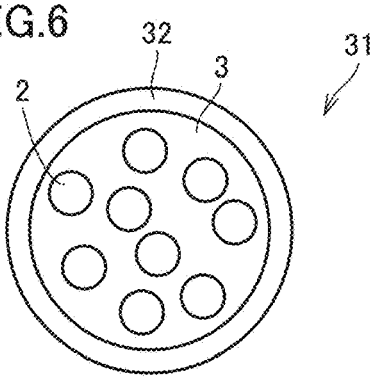
FIG. 6 schematically shows a phosphor containing particle 31 according to a fourth embodiment of the present invention.

FIG. 6 schematically shows a phosphor containing particle (a nanoparticle phosphor element/a microbead) 31 according to a fourth embodiment of the present invention. Note that in FIG. 6, any portion having a configuration similar to that of phosphor containing particle 1 according to the first embodiment shown in FIG. 1 is identically denoted and will not be described. Phosphor containing particle 31 according to the fourth embodiment shown in FIG. 6 is different from phosphor containing particle 1 according to the first embodiment shown in FIG. 1 in that the former has an outermost surface including a translucent coating layer 32. Having the outermost surface including a translucent coating layer 32 is able to reduce oxygen and moisture permeability and is consequently able to significantly reduce or prevent the semiconductor nanoparticle phosphor's photooxidation and hence degradation and further enhance its chemical stability.

Coating layer 32 is not limited in material as long as it is translucent, however, a metal oxide, a silica-based material, or a similar translucent inorganic material is preferred. Furthermore, among these materials, coating layer 32 preferably includes an inorganic material having a band gap of 3.0 eV or more. The inorganic material of a metal oxide having a band gap of 3.0 eV or more and absorbing ultraviolet rays is exemplified for example by $SiO_2$, ZnO, $TiO_2$, $CeO_2$, $SnO_2$, $ZrO_2$, $Al_2O_3$, ZnO:Mg, etc. Among these, ZnO, $TiO_2$, $Al_2O_3$, $CeO_2$, and $SnO_2$ have a band gap close to 3.0 eV, and are thus able to absorb ultraviolet rays in a wide range (up to a range of ultraviolet rays close to visible light). Furthermore, $SiO_2$, $ZrO_2$, and ZnO:Mg have a band gap considerably larger than 3.0 eV, and accordingly, absorb only ultraviolet rays having a considerably short wavelength and transmit ultraviolet rays of a range close to visible light. Having an outermost surface including coating layer 32 including an inorganic material having a band gap of 3.0 eV or more is able to significantly reduce or prevent degradation by ultraviolet rays of the semiconductor nanoparticle phosphor and the resin including the constitutional unit derived from the ionic liquid including the polymerizable functional group and consequently enhance chemical stability. Note that in the present invention it is better if the inorganic material is an inorganic crystal.

(Phosphor Containing Particle According to a Fifth Embodiment)

Figure 7:
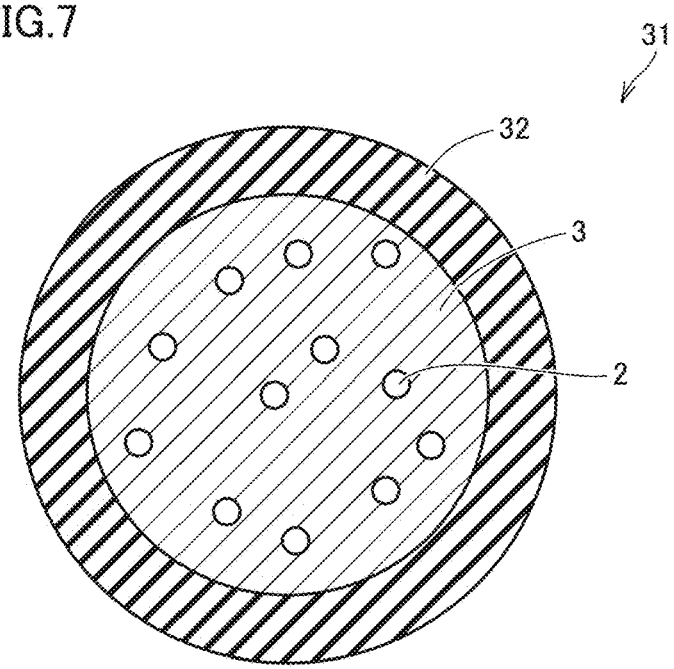
FIG. 7 schematically shows a phosphor containing particle 35 according to a fifth embodiment of the present invention.
Figure 8:
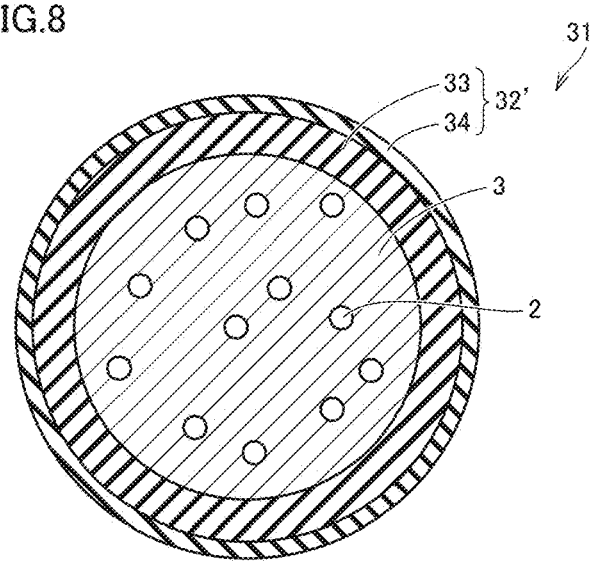
FIG. 8 schematically shows a phosphor containing particle 35' according to a fifth embodiment of the present invention.

FIGS. 7 and 8 schematically show phosphor containing particles (a nanoparticle phosphor element/a microbead) 35, 35' according to a fifth embodiment of the present invention. Note that in FIGS. 7 and 8, any portion having a configuration similar to that of phosphor containing particle 1 according to the first embodiment shown in FIG. 1 is identically denoted and will not be described.

The phosphor containing particle according to a preferred embodiment of the present invention may include supports 38, 38' to seal the matrix.

Supports 38, 38' coating matrix 3 are able to significantly reduce or prevent oxygen and moisture penetration into the matrix. This is able to significantly reduce or prevent the semiconductor nanoparticle phosphor's degradation caused by oxygen and moisture and hence the semiconductor nanoparticle phosphor's degradation in efficiency.

The support preferably has a thickness for example of about 0.5 nm to about 0.5 mm, more preferably about 10 nm to about 100 μm. The thickness of the support is able to be measured using a scanning electron microscope or a transmission electron microscope or the like.

The support is not particularly limited in material as long as it is formed of a material which shields oxygen, moisture etc., and an inorganic material, a polymeric material, etc. are able to be used.

An inorganic material excellently shields oxygen, moisture, etc. Examples of the inorganic material include silica, metal oxide, metal nitride, etc.

The polymeric material has flexibility, and accordingly, when it is used as a material for the support, the phosphor containing particle is improved in shock resistance. Furthermore, when the support is formed on the matrix, the polymeric material is able to be formed under a milder condition than the inorganic material is, and a processing damage to the ionic liquid and semiconductor nanoparticle phosphor in the matrix is able to be significantly reduced or prevented. The polymeric material is able to be acrylate polymer, epoxide, polyamide, polyimide, polyester, polycarbonate, polythioether, polyacrylonitrile, polydien, polystyrene polybutadiene copolymer, parylene, silica-acrylate hybrid, polyetheretherketone, polyvinylidene fluoride, polyvinylidene chloride, polydivinylbenzene, polyethylene, polypropylene, polyethylene terephthalate, polyisobutylene, polyisoprene, cellulose derivative, polytetrafluoroethylene, etc.

As shown in FIG. 8, support 38' is able to be a multilayered structure including a first support 33 and a second support 34. This further enhances oxygen and moisture shieldability. Note that the number of layers is not particularly limited as long as it is two layers or more, and each layer's material is also not particularly limited as long as it has oxygen and moisture shieldability.

Figure 9:
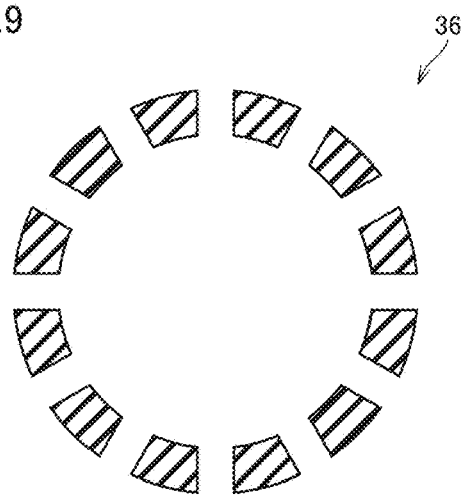
FIG. 9 shows one example of an exemplary variation of a support.
Figure 10:
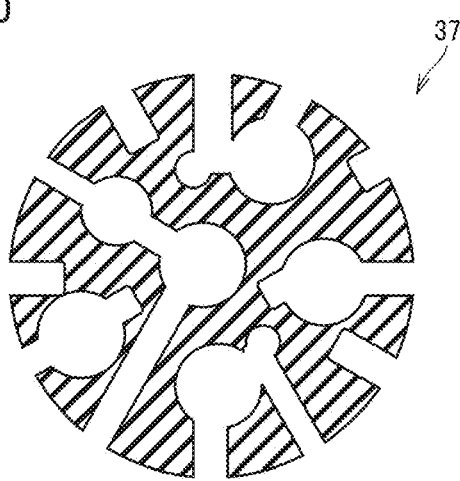
FIG. 10 shows one example of an exemplary variation of the support.

While FIG. 7 shows support 38 having a hollow globular structure entirely covering matrix 3 including the constitutional unit derived from the ionic liquid, the support's shape is not particularly limited as long as it is able to hold matrix 3 therein. For example, it is able to be a support 36 having a hollow capsular structure having pores penetrating from a wall surface into an internal space, as shown in FIG. 9, a globular support 37 having pores extending from a surface inwards, as shown in FIG. 10, etc. These supports preferably have a pore diameter of about 20 nm or more and about 10 μm or less, more preferably about 100 nm or more and about 10 μm or less. With a pore diameter of 10 μm or less, even when a liquid matrix is sealed inside the support, flowing of the matrix out of the support is able to be significantly reduced or prevented. Furthermore, when the pore diameter is in said range, then, for example in a method in which a support such as a hollow capsule having pores is previously produced and subsequently a matrix having a semiconductor nanoparticle phosphor dispersed therein is introduced into the support to produce a nanoparticle phosphor element for producing a phosphor containing particle, the matrix having the semiconductor nanoparticle phosphor dispersed therein is able to be efficiently introduced into the support such as the hollow capsule having pores. This is because a pore diameter of 20 nm or more is larger than any semiconductor nanoparticle phosphor having a particle size of about 1 to about 20 nm preferred for the semiconductor nanoparticle phosphor and the semiconductor nanoparticle phosphor is able to easily pass through the pores, and a pore diameter of 100 nm or more allows the ionic liquid to reach a depth of penetration equivalent to 30 μm, which is a preferred particle size of the phosphor containing particle, in a short period of time of about only 0.1 second. This is derived in Lukas-Washburn equation known as an expression of capillary osmosis, assuming the ionic liquid's representative values γ=30 mNm$^{-1}$, η=50 mPas, and θ=45 degrees. Note that Lukas-Washburn equation is represented as below, where l represents a depth of penetration of a liquid, R represents a radius of a capillary tube, γ represents a surface tension of the liquid, θ represents a contact angle of the liquid and the capillary tube, η represents a coefficient of viscosity of the liquid, and t represents time.

$$l = \sqrt{\frac{R\gamma\cos\theta}{2\eta}t}$$

The support has a surface with an opening, which is able to be sealed after the matrix is sealed in the support.

<Method of Producing Phosphor Containing Particle>

Phosphor containing particle 35 of the example shown in FIG. 7 is able to be produced using an existing capsule production method by coating the nanoparticle phosphor and the matrix with the support, for example. A specific example of the production method is indicated below.

(Producing the Semiconductor Nanoparticle Phosphor)

The method of producing semiconductor nanoparticle phosphor 2 is not particularly limited, and may be any production method. Preferably, a chemical synthesis method is used as the method of producing semiconductor nanoparticle phosphor 2 as the method is a simple and is of a low cost. In the chemical synthesis method, a plurality of starting materials including elements to constitute a substance to be produced are able to be dispersed in a medium and then made to react to obtain the substance to be produced. Such a chemical synthesis method for example includes a sol gel method (a colloid method), a hot soap method, an inverted micelle method, a solvothermal method, a molecular precursor method, a hydrothermal synthesis method, a flux method, etc. Preferably, the hot soap method is used as it is able to suitably produce nanoparticle core 2a including a compound semiconductor material. Hereinafter, an example of the method of producing semiconductor nanoparticle phosphor 2 by the hot soap method will be indicated.

Initially, nanoparticle core 2a is synthesized in liquid phase. For example, when nanoparticle core 2a including InN is produced, 1-octadecene (a synthesizing solvent) is introduced into a flask or the like and tris(dimethylamino) indium and hexadecanethiol (HDT) are mixed together. The liquid mixture is then agitated sufficiently and then made to react at 180-500 degrees centigrade. Thus, nanoparticle core 2a including InN is obtained, and nanoparticle core 2a thus obtained has an external surface with HDT boded thereto. Note that HDT may be added after shell layer 2b is grown.

Preferably, the synthesizing solvent used in the hot soap method is a compound solution including a carbon atom and a hydrogen atom (hereinafter referred to as a "hydrocarbon-based solvent"). This prevents water or oxygen from being introduced into the synthesizing solvent and hence prevents oxidization of nanoparticle core 2a. Preferably, the hydrocarbon-based solvent is for example n-pentane, n-hexane, n-heptane, n-octane, cyclopentane, cyclohexane, cycloheptane, benzene, toluene, o-xylene, m-xylene, p-xylene or the like.

In the hot soap method, theoretically, a longer reaction time provides nanoparticle core 2a having a larger particle size. Accordingly, the size of nanoparticle core 2a is controllable to be a desired size by liquid phase synthesis while monitoring a particle size by photoluminescence, light absorption, dynamic light scattering or the like.

Then, a reaction reagent which is a source material for shell layer 2b is added to the solution containing nanoparticle core 2a, and made to undergo a pyrogenetic reaction. Thus, a starting material for the semiconductor nanoparticle phosphor is obtained. The starting material for the semiconductor nanoparticle phosphor thus obtained has nanoparticle core 2a with an external surface covered with shell layer 2b, and has HDT bonded to an external surface of shell layer 2b.

Subsequently, a modifying organic compound is added to the solution containing the starting material for the semiconductor nanoparticle phosphor, and made to react at a temperature of from room temperature to 300 degrees centigrade. This resolves the bond of the external surface of shell layer 2b and HDT, and the modifying organic compound is bonded to the external surface of shell layer 2b to form modifying organic modifying group 6. Thus, semiconductor nanoparticle phosphor 2 is obtained.

Note that when producing nanoparticle core 2a, the modifying organic compound may be added instead of HDT. When semiconductor nanoparticle phosphor 2 is thus obtained, the modifying organic compound may not be added after shell layer 2b is formed.

(Producing the Support)

Semiconductor nanoparticle phosphor 2 thus obtained is dispersed in a matrix including an ionic liquid as a major component. The volume ratio of the semiconductor nanoparticle phosphor to the resin is able to have a value depending on how the light emitting device is used, and preferably it is 0.000001 or more and 10 or less for example. According to this, the semiconductor nanoparticle phosphor is less likely agglomerate and is dispersible in the resin more uniformly.

Subsequently, matrix 3 having semiconductor nanoparticle phosphor 2 dispersed therein is introduced into a solution including a material for the support and thereafter a process for precipitating the support's material is performed. Thus, a phosphor containing particle in which matrix 3 has a surface covered with the support is able to be obtained.

When the diameter of the phosphor containing particle is 100 μm or less, matrix 3 having semiconductor nanoparticle phosphor 2 dispersed therein that for example has undergone a process using a homogenizer etc. and thus been emulsified (or made fine) is able to be introduced into the solution including the material for the support. Furthermore, when the diameter of the phosphor containing particle is 100 μm or more, matrix 3 having semiconductor nanoparticle phosphor 2 dispersed therein is not subjected to the emulsification process and is instead able to be directly introduced via a syringe etc. into the solution including the material for the support. The thickness of the support is controllable by the period of time, temperature and pH of the process for precipitating the support's material, the concentration of the support's material, etc.

Note that, in the above described production method, the ionic liquid in matrix 3 maintains a liquid state. By causing the ionic liquid to undergo a condensation reaction and curing and resinifying (or solidifying) it to form a resin including a constitutional unit derived from the ionic liquid, a phosphor containing particle in which matrix 3 includes the resin including the constitutional unit derived from the ionic liquid is able to be obtained. The curing can be done by a photo-curing method exposing the intermediate product to ultraviolet rays and thus curing it, a thermosetting method applying heat to the intermediate product and thus curing it, etc.

Other than the above production method, the phosphor containing particle is also be able to be produced for example in such a manner that a hollow capsule having pores is previously produced and subsequently a matrix having a semiconductor nanoparticle phosphor dispersed therein is introduced into the hollow capsule, and the ionic liquid is subjected to a curing process if necessary. According to this method, after the hollow capsule is produced, the matrix having the semiconductor nanoparticle phosphor dispersed therein is introduced into the hollow capsule, so that the phosphor containing particle is able to be produced without a hollow capsule production process giving a processing damage to the semiconductor nanoparticle phosphor or the matrix having the semiconductor nanoparticle phosphor dispersed therein.

<Light Emitting Device>

(Light Emitting Device According to a Sixth Embodiment)

Figure 11:
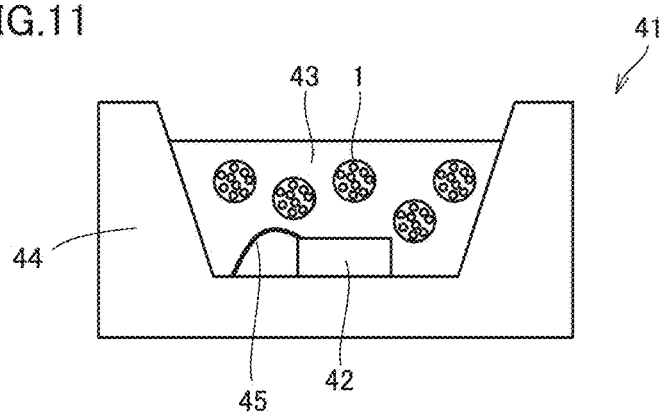
FIG. 11 schematically shows a light emitting device 41 according to a sixth embodiment of the present invention.

FIG. 11 schematically shows a light emitting device 41 according to a sixth embodiment of the present invention. As shown in FIG. 11, a preferred embodiment of the present invention also provides a light emitting device (an LED package) 41 including a light source 42 and a wavelength converter in which phosphor containing particle 1 according to preferred embodiments of the present invention as described above is dispersed in a translucent medium 43. As has been set forth above, the phosphor containing particle according to a preferred embodiment of the present invention is good in handleability, and by producing it in a size approximately the same as a currently used phosphor, it is able to be used in a form similar to that of a currently commercially used phosphor without changing a currently used process. In the light emitting device shown in FIG. 11, components other than phosphor containing particle 1, i.e., light source 42, translucent medium 43, a frame body 44, a lead wire 45, etc. are not particularly limited and are able to be conventionally known, appropriate components.

Note that while FIG. 11 shows a case where phosphor containing particle 1 according to the first embodiment shown in FIG. 1 is used, this is not exclusive, and phosphor containing particles 11, 21, 31, 35 and 35' according to the second to fifth embodiments shown in FIG. 4 to FIG. 8 may be used or three or more types of semiconductor nanoparticle phosphors may be included.

In the light emitting device according to a preferred embodiment of the present invention, the light source is not particularly limited and is able to be a light emitting diode (LED), a laser diode (LD), etc.

In light emitting device 41 according to a preferred embodiment of the present invention, the translucent medium for sealing the light source and the phosphor containing particle (a sealing material) is not particularly limited, however, a glass material or a macromolecular material is preferably used. As the glass material, tetramethoxy silane (TMOS), tetraethoxysilane (TEOS), tetrapropoxysilane, tetrabutoxysilane, etc. are able to be used for example. As the macromolecular material is able to be used a resin including a constitutional unit derived from an ionic liquid including acrylic resin such as polymethylmethacrylate (PMMA), epoxy resin including bisphenol A and epichlorohydrin, etc., MOE-200T (2-(methacryloyloxy)-ethyltrimethyl ammonium bis(trifluoromethane sulfonyl)imide), and 1-(3-acryloyloxy-propyl)-3-methylimidazolium bis(trifluoromethanesulfonyl) imide etc. Other then the above, epoxy, silicone and (meth)acrylate, silica glass, silica gel, siloxane, sol-gel, hydrogel, agarose, cellulose, epoxy, polyether, polyethylene, polyvinyl, polydiacetylene, polyphenylene vinylene, polystyrene, polypyrrole, polyimide, polyimidazole, polysulfone, polythiophene, polyphosphate, poly(meth)acrylate, polyacrylamide, polypeptide, polysaccharide, or a combination thereof may be used as the translucent medium.

The volume ratio of the phosphor containing particle to the medium is able to have a value depending on how the light emitting device is used, and preferably it is 0.000001 or more and 10 or less for example. When the light emitting device's translucency is regarded as important, it is preferable that the volume ratio of the semiconductor nanoparticle phosphor to the medium is 0.2 or less. The volume ratio of 0.2 or less allows the light emitting device to have high translucency. Furthermore, when the quantity of light emitted by the light emitting device is regarded as important, it is preferable that the volume ratio of the nanoparticle phosphor to the medium is 0.00001 or more. The volume ratio of 0.00001 or more allows the light emitting device to emit a large quantity of light.

The medium contains preferably 80% by volume or more, more preferably 90% by volume or more of the glass material or macromolecular material. When the medium contains 80% by volume or more of the glass material or macromolecular material, a highly transparent or highly efficiently light emitting device is able to be provided, and when the matrix contains 90% by volume or more of the material, a further highly transparent or further highly efficiently light emitting device is able to be provided.

What type of phosphor containing particle and what type of medium are combined is not particularly limited, and is able to be selected depending on how the light emitting device is used.

(Light Emitting Device According to a Seventh Embodiment)

Figure 12:
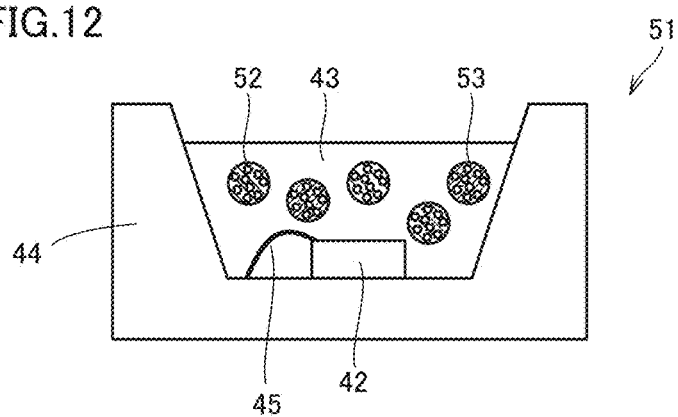
FIG. 12 schematically shows a light emitting device 51 according to a seventh embodiment of the present invention.

FIG. 12 schematically shows a light emitting device 51 according to a seventh embodiment of the present invention. Note that in FIG. 12, any portion having a configuration similar to that of light emitting device 41 according to the sixth embodiment shown in FIG. 11 is identically denoted and will not be described. Light emitting device 51 according to the seventh embodiment shown in FIG. 12 is different from light emitting device 41 according to the sixth embodiment shown in FIG. 11 in that the former includes a phosphor containing particle 52 in which a red fluorescent light emitting semiconductor nanoparticle phosphor is dispersed in a resin including a constitutional unit derived from an ionic liquid including a polymerizable functional group, and a phosphor containing particle 53 in which a green fluorescent light emitting semiconductor nanoparticle phosphor is dispersed in a resin including a constitutional unit derived from an ionic liquid including a polymerizable functional group.

As has been set forth above, the phosphor containing particle according to a preferred embodiment of the present invention is good in handleability, and by producing it in a size approximately the same as a currently used phosphor, it is able to be used in a form similar to that of a currently commercially used phosphor without changing a currently used process. According to light emitting device 51 according to the seventh embodiment, by producing a light emitting device in a process similar to that for a conventional phosphor, and furthermore, using a phosphor containing particle including semiconductor nanoparticle phosphors having different wavelengths, a light emitting device which emits light in a desired color is able to be produced. Note that when, as in light emitting device 51 according to the seventh embodiment, phosphor containing particle 52 in which a red fluorescent light emitting semiconductor nanoparticle phosphor is dispersed in a resin including a constitutional unit derived from an ionic liquid including a polymerizable functional group, and phosphor containing particle 53 in which a green fluorescent light emitting semiconductor nanoparticle phosphor is dispersed in a resin including a constitutional unit derived from an ionic liquid including a polymerizable functional group are used in combination, a light emitting device exhibiting white light emission of high color reproducibility is able to be obtained. Therefore, a light emitting diode (LED) which emits blue light and a laser diode (LD) which emits blue light are able to be suitably used.

Note that while in light emitting device 51 shown in FIG. 12, the mixing ratio of phosphor containing particle 52 in which a red fluorescent light emitting semiconductor nanoparticle phosphor is dispersed in a resin including a constitutional unit derived from an ionic liquid including a polymerizable functional group and phosphor containing particle 53 in which a green fluorescent light emitting semiconductor nanoparticle phosphor is dispersed in a resin including a constitutional unit derived from an ionic liquid including a polymerizable functional group is not particularly limited, in a weight ratio, phosphor containing particle 53 is preferably within a range from about 10 to about 1000 and more preferably within a range from about 20 to about 500, with phosphor containing particle 52 being defined as 100. This is because when a weight ratio of phosphor containing particle 53 is lower than about 10 with phosphor containing particle 52 being defined as 100, a color of light emission tends to significantly deviate from white and to be closer to red due to a difference in light emission intensity between red and green, and when the weight ratio of phosphor containing particle 53 exceeds 1000 with phosphor containing particle 52 being defined as 100, a color of light emission tends to significantly deviate from white and to be closer to green due to a difference in light emission intensity between red and green.

(Light Emitting Device According to an Eighth Embodiment)

Figure 13:
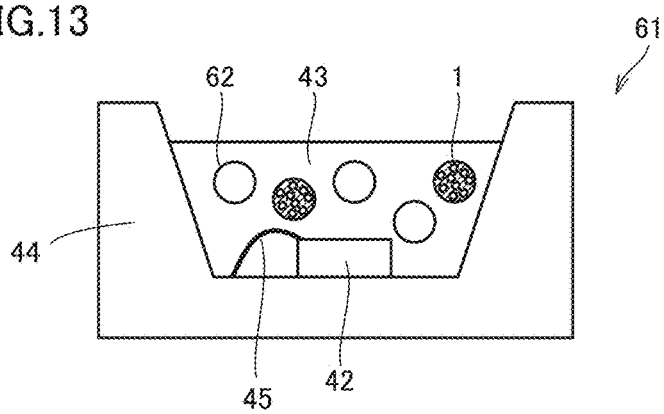
FIG. 13 schematically shows a light emitting device 61 according to an eighth embodiment of the present invention.

FIG. 13 schematically shows a light emitting device 61 according to an eighth embodiment of the present invention. Note that in FIG. 13, any portion having a configuration similar to that of light emitting device 41 according to the sixth embodiment shown in FIG. 11 is identically denoted and will not be described. Light emitting device 61 according to the eighth embodiment shown in FIG. 13 is different from light emitting device 41 according to the sixth embodiment shown in FIG. 11 in that in a medium 43, phosphor containing particle 1 according to a preferred embodiment of the present invention and in addition thereto a phosphor 62 other than the semiconductor nanoparticle phosphor (a phosphor of a conventional type) are dispersed. Thus, in the present invention, a phosphor containing particle according to a preferred embodiment of the present invention and a phosphor of a conventional type may be combined together to provide a light emitting device which emits light in a desired color.

Such a phosphor 62 of a conventionally type for example includes α-sialon phosphor, β-sialon phosphor, JEM blue phosphor (LaAl(Si$_{6-z}$Al$_z$) Ni$_{10-z}$O$_z$), a γ-AlON phosphor or a similar rare earth activated oxynitride phosphor, a YAG:Ce based phosphor or a similar oxide phosphor, a CASN phosphor (CaAlSiN$_3$) or a similar nitride phosphor or a similar inorganic phosphor, a soluble azo pigment, an insoluble azo pigment, a benzimidazolone pigment, a β naphthol pigment, a naphthol AS pigment, a condensed azo pigment or a similar azo based pigment, a phthalocyanine pigment, a quinacridone pigment, a perylene pigment, an isoindolinone pigment, an isoindoline pigment, a dioxazine pigment, a thioindigo pigment, an anthraquinone pigment, a quinophthalone pigment, a metal complex pigment, a diketo-pyrrolo-pyrrole pigment or a similar polycyclic pigment, a dye lake pigment or a similar organic coloring matter etc., and is not particularly limited. Inter alia, in order to implement high chemical stability and a high color rendering property, an inorganic phosphor is preferably used as phosphor 62 of the conventionally type.

In light emitting device 61 according to the eighth embodiment, the mixing ratio of phosphor containing particle 1 and the phosphor of the conventionally type is not particularly limited, either, and although depending on the type of the semiconductor nanoparticle phosphor used and that of the phosphor of the conventionally type used, when the semiconductor nanoparticle phosphor included in the phosphor containing particle is CdSe and the phosphor of the conventionally type is a β-sialon phosphor, then, in a weight ratio, the phosphor of the conventionally type is preferably within a range from about 10 to about 1000 and more preferably within a range from about 20 to about 500, with the phosphor containing particle being defined as 100.

Note that while FIG. 13 shows a case where phosphor containing particle 1 according to the first embodiment shown in FIG. 1 is used, this is not exclusive, and phosphor containing particles 11, 21, 31, 35 and 35' according to the second to fifth embodiments shown in FIG. 4 to FIG. 8 may be used or three or more types of semiconductor nanoparticle phosphors may be included.

Figure 14:
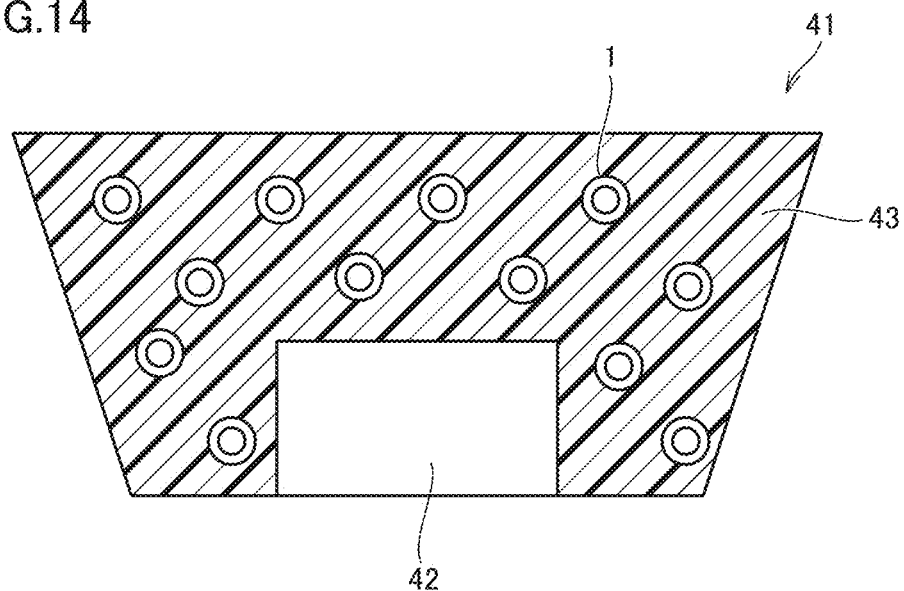
FIG. 14 shows the light emitting device of the example shown in FIG. 11 such that it is partially enlarged.
Figure 15:
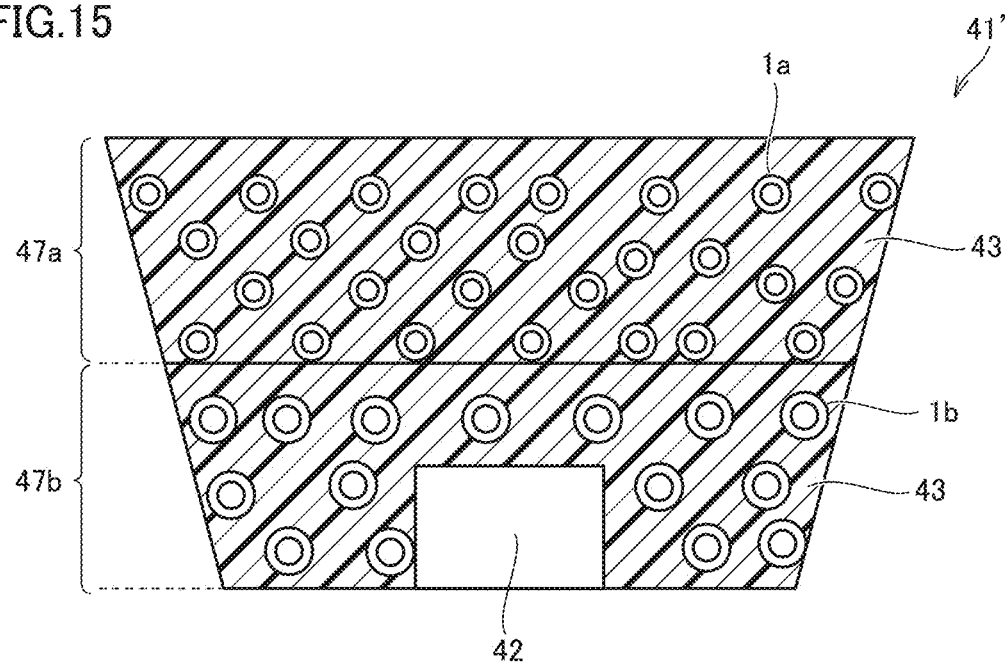
FIG. 15 shows an exemplary variation of the light emitting device shown in FIG. 14.

FIG. 14 shows the light emitting device of the example shown in FIG. 11 such that it is partially enlarged, and FIG. 15 shows an exemplary variation of the light emitting device shown in FIG. 14. As shown in FIG. 15, a light emitting device 41' may have a multi-layered structure including a first light emitting layer 47a in which a first nanoparticle phosphor element 1a is dispersed in medium 43, and a second light emitting layer 47b in which a second nanoparticle phosphor element 1b is dispersed in medium 43. For example when a blue light emitting LED chip is used as light source 42 and thereon second light emitting layer 47b including second nanoparticle phosphor element 1b using a red light emitting nanoparticle phosphor (a red light emitting layer) and first light emitting layer 47a including first nanoparticle phosphor element 1a using a green light emitting nanoparticle phosphor (a green light emitting layer) are deposited in said order, resorption of energy from first light emitting layer 47a (the green light emitting layer) to second light emitting layer 47b (the red light emitting layer) is less likely to occur, and light emitting device 41' emits light satisfactorily efficiently.

<Method of Producing the Light Emitting Device>

When phosphor containing particle 1 is sealed in medium 43, phosphor containing particle 1 is dispersed in medium 43 and thereafter a curing process is performed.

When the glass material is used as medium 43 a solution in which the glass material and phosphor containing particle 1 are mixed together is agitated to disperse phosphor containing particle 1 in the glass material. Then, the glass material is made to undergo condensation reaction and thus cured. In order to accelerate the condensation reaction, heat, an acid or a base and/or the like may be applied to the system.

When the macromolecular material is used as medium 43 a solution in which the macromolecular material and phosphor containing particle 1 are mixed together is agitated to disperse phosphor containing particle 1 in the macromolecular material. Then, the macromolecular material is made to undergo condensation reaction and thus cured and resinified (or solidified). The curing can be done by a photo-curing method exposing the intermediate product to ultraviolet rays and thus curing it, a thermosetting method applying heat to the intermediate product and thus curing it, etc.

An example of the method of producing the light emitting device which has the multi-layered structure will be described below. Although a case of a light emitting device which has a 2-layer structure will be described below, a light emitting device having a structure of 3 or more layers is able to also be produced basically in a similar method. Initially, two types of phosphor containing particles which have different sizes are prepared. A solution of these two types of phosphor containing particles is mixed into an acrylic resin material and the mixture is dropped on a blue light emitting LED chip, and subsequently, a heating and curing process is performed. While being heated and thus cured, phosphor containing particles having a large particle size sediment after a period of time has elapsed, and as a light emitting device a 2-layer structure including a lower layer including phosphor containing particles mainly having a large particle size and an upper layer including phosphor containing particles mainly having a small particle size is formed.

The above production method is able to eliminate a complicated process such as forming each layer independently and allows the production process to be simplified.

<Phosphor Containing Sheet>

(Phosphor Containing Sheet According to a Ninth Embodiment)

Figure 16:
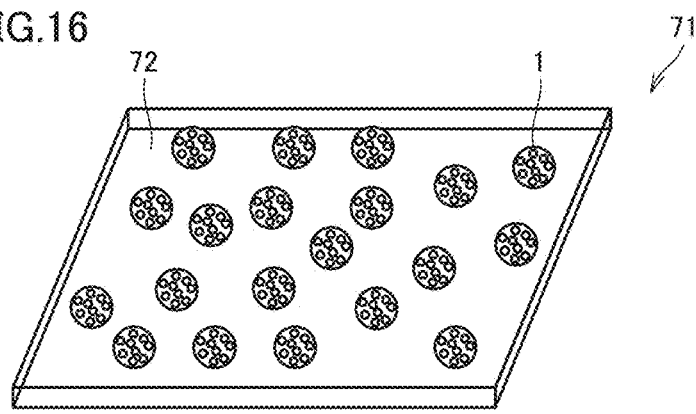
FIG. 16 schematically shows a phosphor containing sheet 71 according to a ninth embodiment of the present invention.

FIG. 16 schematically shows a phosphor containing sheet 71 according to a ninth embodiment of the present invention. The present invention, as shown in FIG. 16, also provides phosphor containing sheet 71 in which phosphor containing particle 1 according to a preferred embodiment of the present invention is dispersed in a sheet-like translucent medium 72. As has been set forth above, the phosphor containing particle according to a preferred embodiment of the present invention is good in handleability, and by producing it in a size approximately the same as a currently used phosphor, it is able to be used in a form similar to that of a currently commercially used phosphor without changing a currently used process. Accordingly, a phosphor containing sheet is able to be produced, like phosphor containing sheet 71 according to the ninth embodiment shown in FIG. 16, in a production process similar to that for a conventional phosphor. Such a phosphor containing sheet according to a preferred embodiment of the present invention is able to be suitably applied to a liquid crystal back light, a white light LED device, etc. similarly as conventional.

Furthermore, the phosphor containing sheet using the phosphor containing particle according to a preferred embodiment of the present invention alleviates a constraint on a material for a medium in which the phosphor containing particle is dispersed, and thus provides an increased degree of freedom in selecting the material for the medium for the following grounds (1) and (2):

(1) In contrast to a semiconductor nanoparticle phosphor resinified in an uncovered state, as conventional, according to the present invention, a semiconductor nanoparticle phosphor may be resinified in a state in which it is included in a phosphor containing particle and thus protected thereby, and it is unnecessary to care about degradation of the semiconductor nanoparticle phosphor at the time of production; and (2) In contrast to an uncovered semiconductor nanoparticle phosphor included in a medium, as conventional, according to the present invention, a semiconductor nanoparticle phosphor is used in a state where it is protected by a phosphor containing particle, and it is unnecessary to care about degradation of the semiconductor nanoparticle phosphor in use.

Furthermore, as it is unnecessary to care about degradation of the semiconductor nanoparticle phosphor in use, a portion for protecting the sheet is unnecessary, and a space is able to also be saved. In other words, a portion for protection which has conventionally been essential in order to prevent moisture and oxygen which are a cause of degradation of a semiconductor nanoparticle phosphor in an uncovered state is able to be dispensed with and thus the sheet is able to be reduced in thickness. More specifically, it is unnecessary to provide an edge portion (or it is able to be reduced), and accordingly, a space is able to be saved in a planar direction, and it is unnecessary to provide a protective layer for protection (or it is able to be reduced), and accordingly, a space is able to be saved in the thickness direction.

As translucent medium 72 used for the phosphor containing sheet according to a preferred embodiment of the present invention, a medium similar to translucent medium 43 described above for a light emitting device according to a preferred embodiment of the present invention is able to be suitably used. Furthermore, a method of forming into a sheet the translucent medium in which the phosphor containing particle according to a preferred embodiment of the present invention is dispersed is similar to that of producing a conventional phosphor containing sheet, e.g., initially as a coating liquid for forming a phosphor sheet a solution in which phosphor containing particles are dispersed in a resin (hereinafter referred to as a "sheet producing, phosphor containing particle dispersed silicone resin") is produced. The sheet producing, phosphor containing particle dispersed silicone resin is obtained by mixing the phosphor containing particles and the resin. When an addition reaction type silicone resin is used, and a compound containing an alkenyl group bonded to a silicon atom and a compound having a hydrogen atom bonded to a silicon atom are mixed, a curing reaction may start even at room temperature, and accordingly, a hydrosilylating reaction retarding agent such as an acetylene compound may be blended with the sheet producing, phosphor containing particle dispersed silicone resin to extend pot life. Furthermore, it is also possible to mix a dispersant, a leveling agent etc. as an additive for stabilizing the coating film, an adhesion assisting agent etc. such as a silane coupling agent, etc. as a modifier for a surface of the sheet, etc. with the sheet producing, phosphor containing particle dispersed silicone resin. Furthermore, it is also possible to mix fine alumina particles, fine silica particles, fine silicone particles, etc. with the sheet producing, phosphor containing particle dispersed silicone resin as a phosphor sedimentation suppressor.

A solvent may be added to provide a solution to make flowability appropriate, if necessary. The solvent is not particularly limited as long as it is able to adjust the resin in a flowing state in viscosity. For example, toluene, methyl ethyl ketone, methyl isobutyl ketone, hexane, terpineol, etc. are mentioned.

After these components are blended to provide a prescribed composition, a homogenizer, a self-revolving agitator, a triple roller, a ball mill, a planetary ball mill, a bead mill or a similar agitator and kneader is used for uniform mixture and dispersion to obtain the sheet producing, phosphor containing particle dispersed silicone resin. After or during the mixture and dispersion, degassing in a vacuum or a decompressed condition is also preferably performed.

Subsequently, the sheet producing, phosphor containing particle dispersed silicone resin is applied on a base member and dried. The resin is able to be applied with a reverse roll coater, a blade coater, a slit-die coater, a direct gravure coater, an offset gravure coater, a kis coater, a natural roll coater, an air knife coater, a roll blade coater, baribar roll blade coater, a two stream coater, a rod coater, a wire bar coater, an applicator, a dip coater, a curtain coater, a spin coater, a knife coater etc. Furthermore, a phosphor sheet according to a preferred embodiment of the present invention is also be able to be produced using printing methods such as screen printing, photogravure, planography. When using a printing method, screen printing is preferably used.

The sheet is able to be dried using a general heating device such as a hot air dryer and an infra-red dryer. The sheet is able to be heated and cured using a general heating device such as a hot air dryer and an infra-red dryer. In that case, the sheet is heated and cured normally at 40 to 250° C. for 1 minute to 5 hours, preferably at 100° C. to 200° C. for 2 minutes to 3 hours.

Note that while FIG. 16 shows a case where phosphor containing particle 1 according to the first embodiment shown in FIG. 1 is used, this is not exclusive, and phosphor containing particles 11, 21, 31, 35 and 35' according to the second to fifth embodiments shown in FIG. 4 to FIG. 8 may be used or three or more types of semiconductor nanoparticle phosphors may be included.

(Phosphor Containing Sheet According to a Tenth Embodiment)

Figure 17:
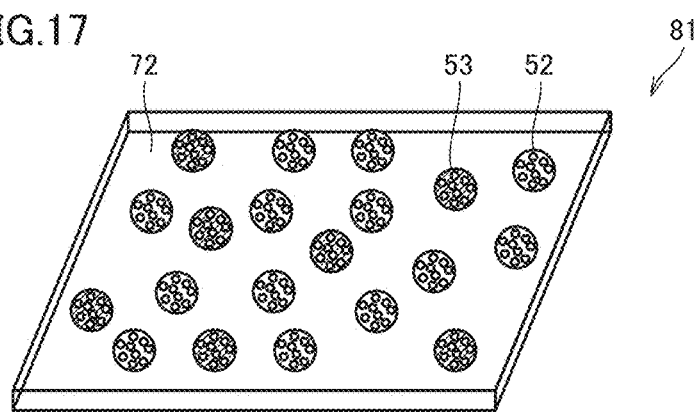
FIG. 17 schematically shows a phosphor containing sheet 81 according to a tenth embodiment of the present invention.

FIG. 17 schematically shows a phosphor containing sheet 81 according to a tenth embodiment of the present invention. Note that in FIG. 17, any portion having a configuration similar to that of phosphor containing sheet 71 according to the ninth embodiment shown in FIG. 16 is identically denoted and will not be described. Phosphor containing sheet 81 according to the tenth embodiment shown in FIG. 17 differs from phosphor containing sheet 71 according to the ninth embodiment shown in FIG. 16 in that former includes phosphor containing particle 52 in which a red fluorescent light emitting semiconductor nanoparticle phosphor is dispersed in a resin including a constitutional unit derived from an ionic liquid including a polymerizable functional group and phosphor containing particle 53 in which a green fluorescent light emitting semiconductor nanoparticle phosphor is dispersed in a resin including a constitutional unit derived from an ionic liquid including a polymerizable functional group.

As has been set forth above, the phosphor containing particle according to a preferred embodiment of the present invention is good in handleability, and by producing it in a size approximately the same as a currently used phosphor, it is able to be used in a form similar to that of a currently commercially used phosphor without changing a currently used process. According to phosphor containing sheet 81 according to the tenth embodiment, by producing a phosphor containing sheet in a process similar to that for a conventional phosphor, and furthermore, using a phosphor containing particles including semiconductor nanoparticle phosphors having different wavelengths, and by combining the same with an appropriate light source, a phosphor containing sheet which allows light to be emitted in a desired color is able to be produced. Note that when, as in phosphor containing sheet 81 according to the tenth embodiment, phosphor containing particle 52 in which a red fluorescent light emitting semiconductor nanoparticle phosphor is dispersed in a resin including a constitutional unit derived from an ionic liquid including a polymerizable functional group and phosphor containing particle 53 in which a green fluorescent light emitting semiconductor nanoparticle phosphor is dispersed in a resin including a constitutional unit derived from an ionic liquid including a polymerizable functional group are used in combination, a light emitting device exhibiting white light emission of high color reproducibility is able to be obtained. Therefore, a light emitting diode (LED) which emits blue light and a laser diode (LD) which emits blue light are able to be combined as a light source suitably and thus used.

Note that while in phosphor containing sheet 81 shown in FIG. 17, the mixing ratio of phosphor containing particle 52 in which a red fluorescent light emitting semiconductor nanoparticle phosphor is dispersed in a resin including a constitutional unit derived from an ionic liquid including a polymerizable functional group and phosphor containing particle 53 in which a green fluorescent light emitting semiconductor nanoparticle phosphor is dispersed in a resin including a constitutional unit derived from an ionic liquid including a polymerizable functional group is not particularly limited, in a weight ratio, phosphor containing particle 53 is preferably within a range from about 10 to about 1000 and more preferably within a range from about 20 to about 500, with phosphor containing particle 52 being defined as 100. This is because when a weight ratio of phosphor containing particle 53 is lower than about 10 with phosphor containing particle 52 being defined as 100, a color of light emission tends to significantly deviate from white and to be closer to red due to a difference in light emission intensity between red and green, and when the weight ratio of phosphor containing particle 53 exceeds 1000 with phosphor containing particle 52 being defined as 100, a color of light emission tends to significantly deviate from white and to be closer to green due to a difference in light emission intensity between red and green.

(Phosphor Containing Sheet According to an Eleventh Embodiment)

Figure 18:
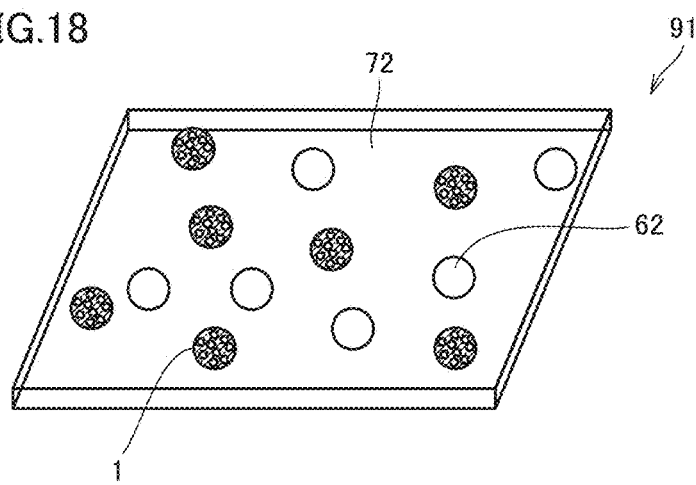
FIG. 18 schematically shows a phosphor containing sheet 91 according to an eleventh embodiment of the present invention.

FIG. 18 schematically shows a phosphor containing sheet 91 according to an eleventh embodiment of the present invention. Note that in FIG. 18, any portion having a configuration similar to that of phosphor containing sheet 71 according to the ninth embodiment shown in FIG. 16 is identically denoted and will not be described. Phosphor containing sheet 91 according to the eleventh embodiment shown in FIG. 18 differs from phosphor containing sheet 71 according to the ninth embodiment shown in FIG. 16 in that in a medium 72, phosphor containing particle 1 according to a preferred embodiment of the present invention and in addition thereto phosphor 62 other than the semiconductor nanoparticle phosphor (a phosphor of a conventional type) are dispersed. Thus, in the present invention, a phosphor containing particle according to a preferred embodiment of the present invention and a phosphor of a conventional type may be combined together and furthermore combined with an appropriate light source to provide a light emitting device which emits light in a desired color.

As phosphor 62 of the conventionally type a phosphor similar to that described above for light emitting device 61 according to the eighth embodiment is able to be suitably used. Furthermore, the mixing ratio of phosphor containing particle 1 and the phosphor of the conventionally type is not particularly limited, either, and it is as has been described above as a suitable example.

Note that while FIG. 18 shows a case where phosphor containing particle 1 according to the first embodiment shown in FIG. 1 is used, this is not exclusive, and phosphor containing particles 11, 21, 31, 35 and 35' according to the second to fifth embodiments shown in FIG. 4 to FIG. 8 may be used or three or more types of semiconductor nanoparticle phosphors may be included.

The present invention will now be more specifically in examples. Note, however, that these examples do not limit the present invention. Hereinafter, "A/B" represents that A is covered with B.

Example 1

Example 1 presents a phosphor containing particle in which the nanoparticle core is InP, the shell layer is ZnS, the organic modifying group is dimethylamino ethanethiol (DAET), the matrix is a resin including a constitutional unit derived from MOE-200T, and the support is silica (the semiconductor nanoparticle phosphor: InP/ZnS/DAET, and the phosphor containing particle: the semiconductor nanoparticle phosphor/a resin including a constitutional unit derived from MOE-200T/silica).

(Producing the Phosphor Containing Particle)

An octadecene (ODE) solution of a semiconductor nanoparticle phosphor in which the nanoparticle core includes InP, the shell layer includes ZnS and the organic modifying group includes hexadecanethiol (HDT) was prepared. This semiconductor nanoparticle phosphor underwent an organic modifying group substitution treatment to substitute HDT with DAET, and was moved into an MOE-200T solvent.

Subsequently, a hollow silica capsule having pores having an average particle size of about 10 μm was prepared. Specifically, initially, an aqueous phase adjusted so that an aqueous solution of 30% sodium silicate and an aqueous solution of polymethylmethacrylate were 0.42 g/ml and 0.14 g/ml, respectively (a W1 phase), an n-hexane phase adjusted so that Tween 80 (polyoxyethylene sorbitan monooleate) and Span 80 (sorbitan monooleate) were 0.014 g/ml and 0.007 g/ml, respectively (an O phase), and an aqueous phase adjusted so that ammonium hydrogencarbonate was 0.16 g/ml (a W2 phase) were prepared. The W1 phase was add to the O phase and subsequently they were emulsified with a homogenizer at a rotation speed of 8000 rpm to produce a W1/O phase, which was immediately added to the W2 phase and agitated with a magnetic stirrer at 35° C. for 2 hours. Subsequently, water or ethanol was added to the solution which was in turn centrifuged and subjected to an operation repeatedly to remove a supernatant and washed, and thereafter filtrated to obtain a precipitate. Subsequently, the precipitate was dried at 100° C. for 12 hours and then baked at 700° C. for 5 hours to obtain a hollow silica capsule having pores having an average particle size of about 10 μm.

The obtained hollow silica capsule and the semiconductor nanoparticle phosphor containing MOE-200T were mixed together and vacuumed to introduce the MOE-200T solution into the capsule. And a silica source material was dropped and dried to close the pores on the surface of the capsule. Finally, the intermediate product was heated at 80° C. to polymerize and thus resinify the MOE-200T. The obtained phosphor containing particle has the configuration of the semiconductor nanoparticle phosphor/a resin including a constitutional unit derived from MOE-200T/silica.

(Producing the Light Emitting Device)

The obtained phosphor containing particle was mixed into acrylic resin and the mixture was dropped on a blue LED chip, and the acrylic resin was cured to produce an LED light emitting device.

(Observation Result)

Figure 19:
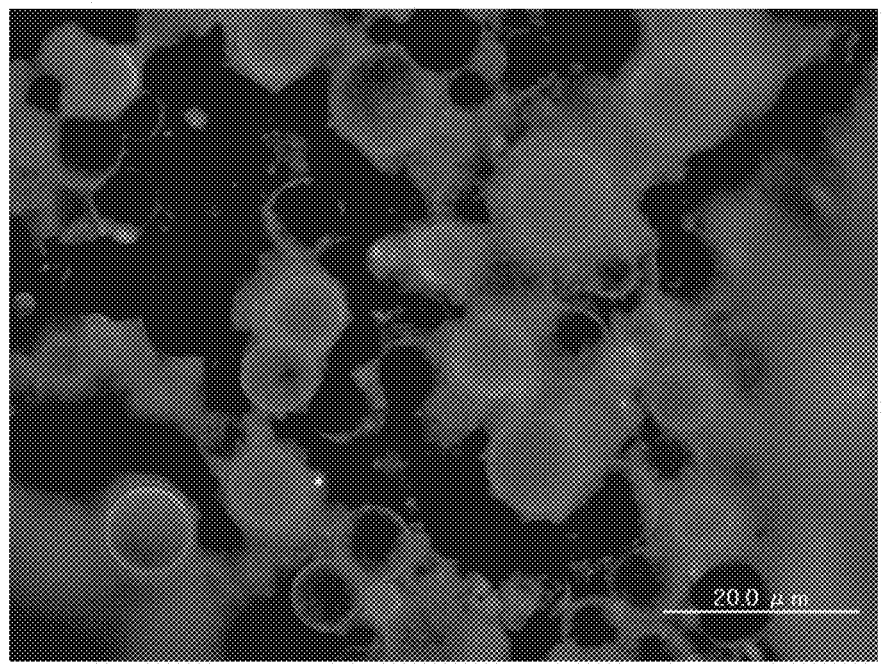
FIG. 19 is an optical microscopic image obtained when the phosphor containing particle of Example 1 is irradiated with excitation light having a wavelength of 405 nm.
Figure 20:
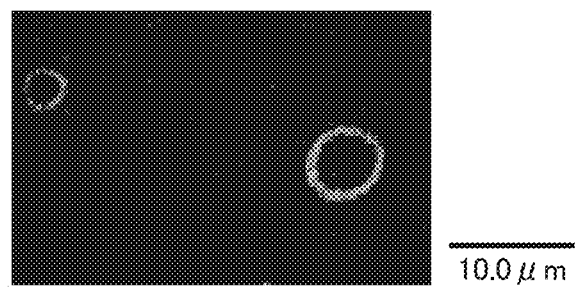
FIG. 20 shows a cross-sectional SEM analysis result of a hollow silica capsule.

FIG. 19 is an optical microscopic image obtained when the phosphor containing particle of the present example is irradiated with excitation light having a wavelength of 405 nm. In FIG. 19, it can be confirmed that the phosphor containing particle emits red light. Furthermore, in the phosphor containing particle's EDX composition analysis result, neither a resin including a constitutional unit derived from an ionic liquid nor a component of the semiconductor nanoparticle phosphor is detected, and It can be said that on the surface of the phosphor containing particle, neither a resin including a constitutional unit derived from an ionic liquid nor the semiconductor nanoparticle phosphor is present. That is, it is believed that the light emission is attributed to the semiconductor nanoparticle phosphor in the resin including the constitutional unit derived from the ionic liquid, that is present inside the phosphor containing particle. Note that from the FIG. 20 cross-sectional SEM analysis result the hollow silica capsule's layer has a thickness of about 1 μm, which an EDX electron beam substantially cannot penetrate, and accordingly, the particle's internal elements are not detected by EDX.

(Performance Assessment)

The obtained light emitting device underwent a lighting test and a heat resistance test. In the lighting test, the light emitting device was let to absorb excitation light having a wavelength of 405 nm and emit fluorescent light and the emission's intensity was measured, and the ratio of the number of emitted photons to the number of absorbed photons was presented as emission efficiency. In the heat resistance test, the light emitting device was heated in an electric furnace at 120° C. for a fixed period of time and subsequently subjected to measurement of quantum efficiency.

(Result)

The light emitting device of the present example, as observed for change over time in the lighting test, presented satisfactory quantum efficiency and satisfactorily reduced or prevented degradation of efficiency over time. Furthermore, a result of the heat resistance test showed that the light emitting device maintained satisfactory quantum efficiency.

Comparative Example 1

A light emitting device having a semiconductor nanoparticle phosphor similar to that of Example 1 dispersed directly into a matrix was used as comparative example 1 (the light emitting device: a semiconductor nanoparticle phosphor/acrylic resin).

(Producing the Light Emitting Device)

An ODE solution of a semiconductor nanoparticle phosphor in which the nanoparticle core includes InP, the shell layer includes ZnS and the organic modifying group includes hexadecanethiol (HDT) was prepared. This semiconductor nanoparticle phosphor underwent an organic modifying group substitution treatment to substitute HDT with DAET and a semiconductor nanoparticle phosphor was thus obtained. Then the semiconductor nanoparticle phosphor was centrifuged an dried to be powder which was in turn mixed into acrylic resin to obtain a mixture which was in turn dropped on a blue LED chip and the acrylic resin was cured to produce an LED light emitting device.

(Performance Assessment)

The obtained light emitting device underwent a lighting test and a heat resistance test similarly as done in Example 1.

(Result)

When the light emitting device of the present comparative example was compared with that of Example 1, the former presented poor initial quantum efficiency and the heat resistance test also indicated the former presented a large degree of degradation of efficiency over time.

(Discussion)

In comparative example 1, the semiconductor nanoparticle phosphor was directly mixed into a general resin such as acryl, which causes the semiconductor nanoparticle phosphor to agglomerate, which is a cause of reduction in efficiency, and the light emitting device was impaired in efficiency. Furthermore, in a general resin such as acryl, the organic modifying group on the surface of the semiconductor nanoparticle phosphor easily detaches, which is a cause of degradation of the semiconductor nanoparticle phosphor, and the light emitting device was impaired in efficiency. Furthermore, a general resin such as acryl allows oxygen and moisture to permeate therethrough to some extent. Oxygen and moisture are a cause of degradation of the semiconductor nanoparticle phosphor, and the light emitting device's efficiency was decreased as time elapses.

Example 1A

Example 1A presents a nanoparticle phosphor element was prepared in which the nanoparticle core includes CdSe, the shell layer includes ZnS, the organic modifying group includes dimethylamino ethanethiol (DAET), the matrix includes a resin including a constitutional unit derived from MOE-200T, and the support includes silica (the semiconductor nanoparticle phosphor: CdSe/ZnS/DAET, and the phosphor containing particle: the semiconductor nanoparticle phosphor/a resin including a constitutional unit derived from MOE-200T/silica).

(Producing the Phosphor Containing Particle)

A toluene solution of a semiconductor nanoparticle phosphor in which the nanoparticle core includes CdSe and the shell layer includes ZnS was prepared, and this semiconductor nanoparticle phosphor underwent an organic modifying group substitution treatment for substitution with DAET, and was moved into an MOE-200T solvent. Subsequently, a phosphor containing particle having the configuration of the semiconductor nanoparticle phosphor/a resin including a constitutional unit derived from MOE-200T/silica was produced similarly as done in Example 1.

(Producing the Light Emitting Device)

The obtained phosphor containing particle was mixed into acrylic resin and the mixture was dropped on a blue LED chip, and the acrylic resin was cured to produce an LED light emitting device.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

In the present example, the semiconductor nanoparticle phosphor has the configuration of CdSe/ZnS/DAET. It can be seen from Example 1 and Example 1A that in the phosphor containing particle, the semiconductor nanoparticle phosphor's core/shell structure is not limited to a single type and is able to be selected as appropriate. This increases a degree of freedom in design in producing the semiconductor nanoparticle phosphor and the phosphor containing particle.

Example 2

Example 2 presents the phosphor containing particle of Example 1 with the support including polyamidoimide resin rather than silica (the semiconductor nanoparticle phosphor: InP/ZnS/DAET, and the phosphor containing particle: the semiconductor nanoparticle phosphor/a resin including a constitutional unit derived from MOE-200T/polyamidoimide resin).

(Producing the Phosphor Containing Particle)

An ODE solution of a semiconductor nanoparticle phosphor in which the nanoparticle core includes InP, the shell layer includes ZnS and the organic modifying group includes hexadecanethiol (HDT) was prepared. This semiconductor nanoparticle phosphor underwent an organic modifying group substitution treatment to substitute HDT with DAET, and was moved into an MOE-200T solvent. The semiconductor nanoparticle phosphor containing MOE-200T solvent was mixed with a solution in which a polyamidoimide resin material was dissolved, and the mixture was heated and agitated to resinify MOE-200T and also form the polyamidoimide resin to surround MOE-200T. The obtained phosphor containing particle has the configuration of the semiconductor nanoparticle phosphor/a resin including a constitutional unit derived from MOE-200T/polyamidoimide resin.

(Producing the Light Emitting Device)

The obtained phosphor containing particle was mixed into acrylic resin and the mixture was dropped on a blue LED chip, and the acrylic resin was cured to produce an LED light emitting device.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

Polyamidoimide resin is able to reduce permeation of oxygen and moisture to some extent, and secular degradation of the semiconductor nanoparticle phosphor was able to be significantly reduced or prevented. Furthermore, when the support is directly formed on the resin including the constitutional unit derived from the ionic liquid by a chemical, physicochemical, or mechanical methodology or the like, a polymeric support is able to be formed under a relatively milder processing condition than a support including silica or a similar inorganic substance, and is thus able to advantageously reduce a processing damage to the resin including the constitutional unit derived from the ionic liquid and the semiconductor nanoparticle phosphor. Furthermore, a polymeric material is more flexible than an inorganic material, and is thus advantageously less crackable and has excellent shock resistance.

Example 3

Example 3 presents the semiconductor nanoparticle phosphor of Example 1 with the organic modifying group including carboxydecanethiol (CDT) rather than DAET (the nanoparticle phosphor: InP/ZnS/CDT, and the phosphor containing particle: the semiconductor nanoparticle phosphor/a resin including a constitutional unit derived from MOE-200T/silica).

(Producing the Phosphor Containing Particle)

An ODE solution of a semiconductor nanoparticle phosphor in which the nanoparticle core includes InP, the shell layer includes ZnS and the organic modifying group includes hexadecanethiol (HDT) was prepared. This semiconductor nanoparticle phosphor underwent an organic modifying group substitution treatment to substitute HDT with CDT, and was moved into an MOE-200T solvent. Subsequently, a phosphor containing particle having the configuration of the semiconductor nanoparticle phosphor/a resin including a constitutional unit derived from MOE-200T/silica was produced in a method similar to that used in Example 1.

(Producing the Light Emitting Device)

The obtained phosphor containing particle was mixed into acrylic resin and the mixture was dropped on a blue LED chip, and the acrylic resin was cured to produce an LED light emitting device.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

In the present example, CDT including a polar group (a carboxyl group) was used as the organic modifying group, and accordingly, the semiconductor nanoparticle phosphor had satisfactory dispersibility into the ionic liquid. It can be seen from the present example that the organic modifying group is not limited to an ionic organic modifying group and is able to be an organic modifying group including a polar functional group. This increases a degree of freedom in design in producing the semiconductor nanoparticle phosphor and the phosphor containing particle.

Example 4

Example 4 presents the phosphor containing particle of Example 1 with the support having a 2-layer structure including polyamidoimide resin and silica rather than (a monolayer of) silica (the semiconductor nanoparticle phosphor: InP/ZnS/DAET, and the phosphor containing particle: the semiconductor nanoparticle phosphor/a resin including a constitutional unit derived from MOE-200T/polyamidoimide resin/silica).

(Producing the Phosphor Containing Particle)

An ODE solution of a semiconductor nanoparticle phosphor in which the nanoparticle core includes InP, the shell layer includes ZnS and the organic modifying group includes hexadecanethiol (HDT) was prepared. This semiconductor nanoparticle phosphor underwent an organic modifying group substitution treatment to substitute HDT with DAET, and was moved into an MOE-200T solvent. The semiconductor nanoparticle phosphor containing MOE-200T solvent was mixed with a solution in which a polyamidoimide resin material was dissolved, and the mixture was heated and agitated to resinify MOE-200T and also form the polyamidoimide resin to surround MOE-200T. Subsequently, a silica source material was dropped and thereafter a silica layer formation reaction was performed in a basic atmosphere for a fixed period of time and a washing and drying treatment was performed to form a silica layer to surround the polyamidoimide resin. The obtained phosphor containing particle has the configuration of the semiconductor nanoparticle phosphor/a resin including a constitutional unit derived from MOE-200T/polyamidoimide resin/silica.

(Producing the Light Emitting Device)

The obtained phosphor containing particle was mixed into acrylic resin and the mixture was dropped on a blue LED chip, and the acrylic resin was cured to produce an LED light emitting device.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

In the present example, the support is a multilayer, and accordingly it is able to satisfactorily reduce or prevent permeation of oxygen and moisture, and secular degradation of the semiconductor nanoparticle phosphor is able to be significantly reduced or prevented. Furthermore, since the silica layer formation process is performed under the basic condition after the resin including the constitutional unit derived from the ionic liquid is covered with a polymeric support, the resin including the constitutional unit derived from the ionic liquid is able to be protected from the base. This is able to reduce a processing damage to the ionic liquid and the semiconductor nanoparticle phosphor in forming the silica layer.

Example 5

Example 5 presents a light emitting device having a 2-layer structure produced using two types of phosphor containing particles.

(Producing a Red Light Emitting Phosphor Containing Particle)

A method similar to that used in Example 1 was used to produce a phosphor containing particle having a structure of InP/ZnS/DAET/silica. This phosphor containing particle had a light emission peak wavelength in the red spectrum region.

(Producing a Green Light Emitting Phosphor Containing Particle)

A method similar to that used in Example 1 was used to produce a phosphor containing particle having a structure of InP/ZnS/DAET/silica. This phosphor containing particle had a light emission peak wavelength in the green spectrum region.

Note that the red light emitting semiconductor nanoparticle phosphor has a larger particle size than the green light emitting semiconductor nanoparticle phosphor, and a red light emitting nanoparticle phosphor element also has a larger particle size than a green light emitting nanoparticle phosphor element.

(Producing the Light Emitting Device)

A solution including these two types of phosphor containing particles was mixed into an acrylic resin material and the mixture was dropped on a blue light emitting LED chip, and subsequently, a heating and curing process was performed. While being heated and thus cured, a red light emitting nanoparticle phosphor device having a large particle size sedimented after a period of time has elapsed, and as a light emitting device a 2-layer structure was formed which included a lower layer mainly including red light emitting phosphor containing particles and an upper layer mainly including green light emitting phosphor containing particles.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

The structure of the light emitting device of the present example (a structure in which a blue light emitting LED chip light source, a red light emitting layer, and a green light emitting layer deposited in said order) is less likely to cause resorption of energy from the green light emitting layer to the red light emitting layer, and thus has better light emission efficiency as an LED light emitting device. Furthermore, the difference in size between the green light emitting phosphor containing particle and the red light emitting phosphor containing particle is able to be exploited so that after they are mixed into acrylic resin they are able to be left to allow the particles having the larger size to sediment to form a 2-layer structure. This is able to eliminate a complicated process such as forming the green light emitting layer and the red light emitting layer independently and thus allows the production process to be simplified.

Example 6

Example 6 presents the phosphor containing particle of Example 1A with the matrix of the resin including the constitutional unit derived from MOE-200T replaced with an ionic liquid including a constitutional unit derived from DEME (the semiconductor nanoparticle phosphor: CdSe/ZnS/DAET, and the phosphor containing particle: the semiconductor nanoparticle phosphor/DEME/silica).

(Producing the Phosphor Containing Particle)

Specifically, a toluene solution of a semiconductor nanoparticle phosphor in which the nanoparticle core includes CdSe and the shell layer includes ZnS was prepared, and this semiconductor nanoparticle phosphor underwent an organic modifying group substitution treatment for substitution with DAET, and was moved into a DEME solvent. Subsequently, a phosphor containing particle having the configuration of the semiconductor nanoparticle phosphor/the ionic liquid including the constitutional unit derived from DEME/silica was produced similarly as done in Example 1, except that the step of heating at 80° C. to resinify the ionic liquid was not performed.

(Producing the Light Emitting Device)

The obtained phosphor containing particle was mixed into acrylic resin and the mixture was dropped on a blue LED chip, and the acrylic resin was cured to produce an LED light emitting device.

(Performance Assessment)

The obtained light emitting device underwent a lighting test similarly as done in Example 1.

(Result) The light emitting device of the present example had satisfactory quantum efficiency and satisfactorily reduced or prevented degradation of efficiency over time.

(Discussion)

In the present example, the matrix of the phosphor containing particle includes an ionic liquid including a constitutional unit derived from DEME. It can be seen from the present example that in the nanoparticle phosphor element the matrix including the constitutional unit derived from the ionic liquid is not limited to a solid (a resin) and may be a liquid. This increases a degree of freedom in design in producing the semiconductor nanoparticle phosphor and the phosphor containing particle.

Example 7

Example 7 presents the phosphor containing particle of Example 1A with a non-globular support used to hold an ionic liquid (the semiconductor nanoparticle phosphor: CdSe/ZnS/DAET, and the phosphor containing particle: the semiconductor nanoparticle phosphor/MOE-200T/silica).

(Producing the Phosphor Containing Particle)

The support of the present example was produced as follows: Initially, an aqueous phase adjusted so that an aqueous solution of 30% sodium silicate and an aqueous solution of polymethylmethacrylate were 0.83 g/ml and 0.28 g/ml, respectively (a W1 phase), a hexane phase adjusted so that Tween 80 (polyoxyethylene sorbitan monooleate) and Span 80 (sorbitan monooleate) were 0.014 g/ml and 0.007 g/ml, respectively (an O phase), and an aqueous phase adjusted so that ammonium hydrogencarbonate was 0.16 g/ml (a W2 phase) were prepared. The W1 phase was add to the O phase and subsequently they were agitated with a magnetic stirrer at a rotation speed of 900 rpm, and the intermediate product was added to the W2 phase and agitated with a magnetic stirrer at 35° C. for 2 hours.

Figure 21:
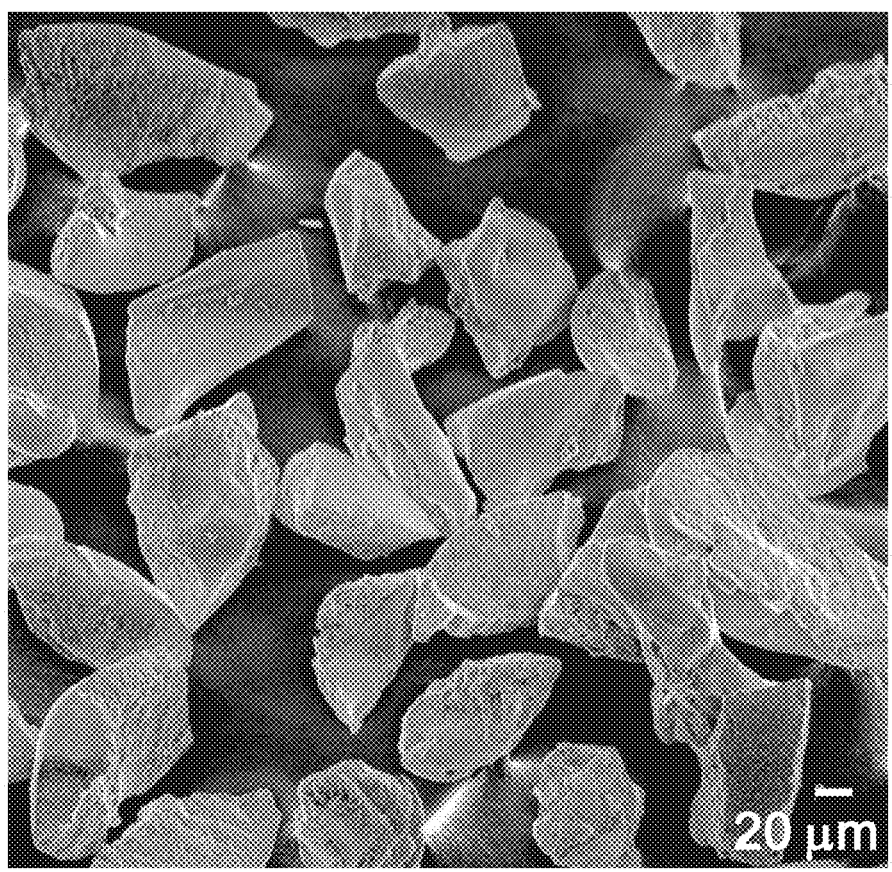
FIG. 21 shows a SEM analysis result of a support of Example 7.

Subsequently, water or ethanol was added to the solution which was in turn centrifuged and subjected to an operation repeatedly to remove a supernatant and washed, and thereafter filtrated to obtain a precipitate. Subsequently, the precipitate was dried at 100° C. for 12 hours and then baked at 700° C. for 5 hours to obtain a silica having an average particle size of about 80 μm and having polygonal pores (hereinafter also referred to as "pored silica") as shown in an SEM analysis result shown in FIG. 21.

The obtained pored silica and a semiconductor nanoparticle phosphor containing MOE-200T were mixed together and vacuumed to introduce the MOE-200T solution into the pored silica. Finally, the intermediate product was heated at 80° C. to polymerize and thus resinify the MOE-200T. The obtained phosphor containing particle has the configuration of the semiconductor nanoparticle phosphor/a resin including a constitutional unit derived from MOE-200T/silica.

(Producing the Light Emitting Device)

The obtained phosphor containing particle was mixed into acrylic resin and the mixture was dropped on a blue LED chip, and the acrylic resin was cured to produce an LED light emitting device.

(Observation Result)

Figure 22:
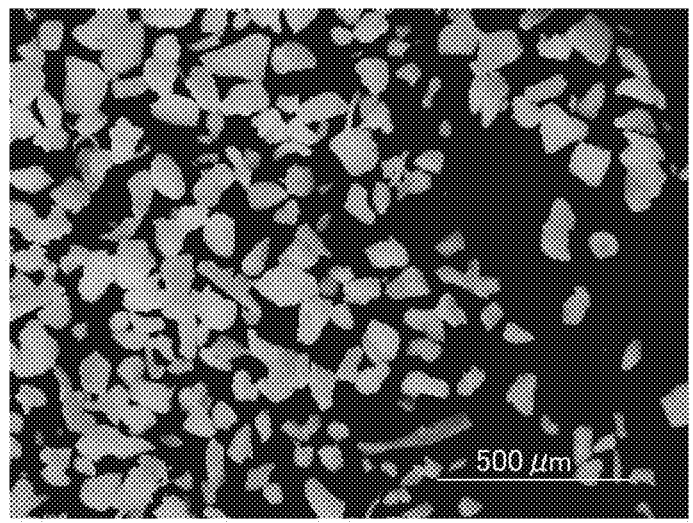
FIG. 22 is an optical microscopic image obtained when the phosphor containing particle of Example 7 is irradiated with excitation light having a wavelength of 405 nm.

FIG. 22 is an optical microscopic image obtained when the phosphor containing particle of the present example is irradiated with excitation light having a wavelength of 405 nm. In FIG. 22, it can be confirmed that the phosphor containing particle emits light.

(Performance Assessment)

The obtained light emitting device underwent a lighting test similarly as done in Example 1.

(Result)

The light emitting device of the present example had satisfactory quantum efficiency and satisfactorily reduced or prevented degradation of efficiency over time.

(Discussion)

In the present example, the support holding the ionic liquid has a non-globular shape. Furthermore, in the present example, the pored silica holding the resin including the constitutional unit derived from the ionic liquid does not undergo a process for closing the pores. It can be seen from Example 3 that the present invention may have the support holding the ionic liquid in a non-globular structure and is also able to significantly reduce or prevent degradation of efficiency over time without a process for closing the pores of the support holding the ionic liquid. Note that while the present example presents a combination of the resin including the constitutional unit derived from the ionic liquid and a pored silica having pores open (resin/pore open), it is believed that a combination of the resin including the constitutional unit derived from the ionic liquid and a pored silica having pores closed (resin/pore closed) is also able to provide a similar effect. Furthermore, it is also believed that a combination of the ionic liquid that is not resinified and a pored silica having pores open (liquid/pore open) and a combination of the ionic liquid that is not resinified and a pored silica having pores closed (resin/pore closed) are also able to provide a similar effect.

Example 8

Figure 23:
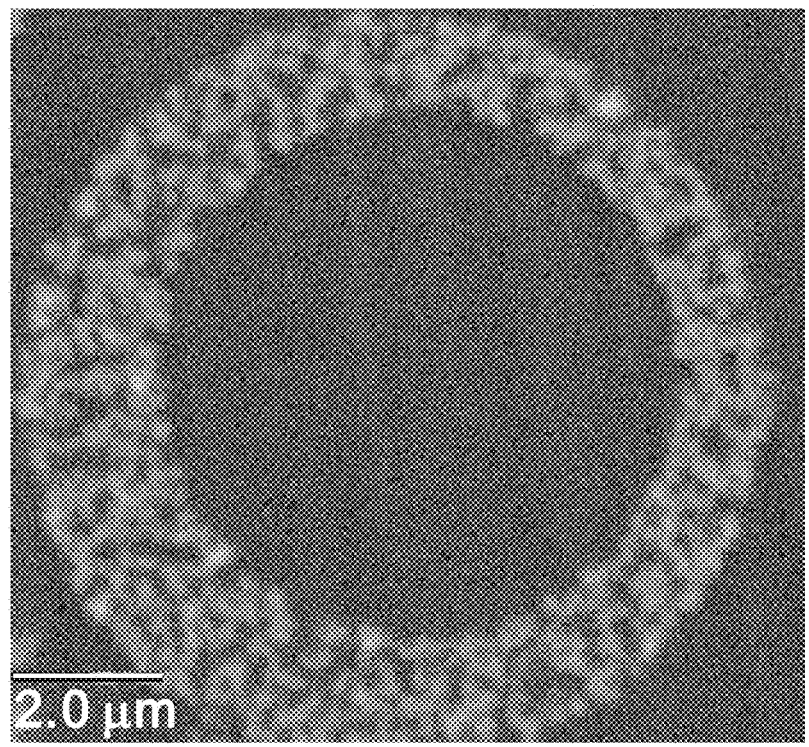
FIG. 23 is a cross-sectional SEM image of one example of a support of Example 8.
Figure 24:
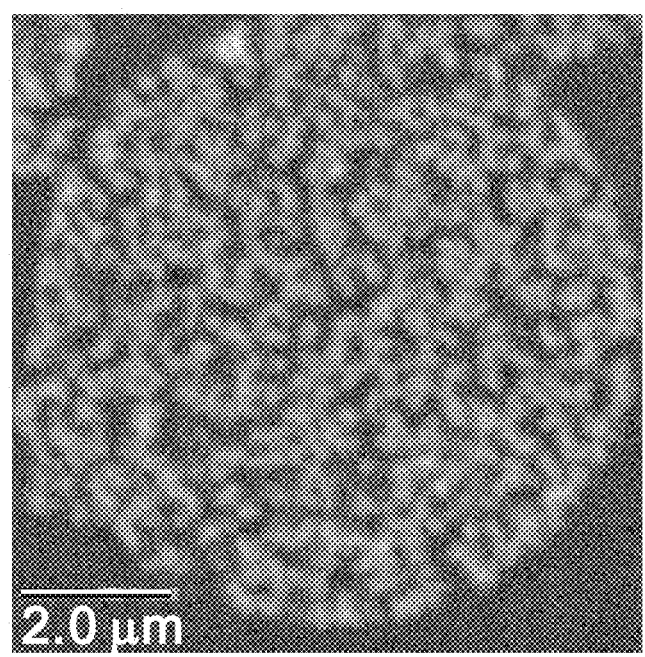
FIG. 24 is a cross-sectional SEM image of one example of the support of Example 8.

In Example 8, a support 36 having a shape shown in FIG. 9 or a support 37 having a shape shown in FIG. 10 were produced. Specifically, the methodology of producing the hollow silica capsule of Example 1 having an average particle size of about 10 μm and having pores was used with each source material varied in concentration to produce the support having the shape shown in FIG. 9 or FIG. 10 FIG. 23 is a cross-sectional SEM image of a support having a hollow capsular structure having pores penetrating from a wall surface into an internal space and having a diameter of about 0.3 μm. FIG. 24 is a cross-sectional SEM image of a globular support having pores extending from a surface inwards and having a diameter of about 0.3 μm. Note that the diameter of the pore of the hollow silica capsule of Example 1 was about 20 nm. These supports are able to be used as a support holding an ionic liquid, similarly as done in the other Examples.

It should be understood that the preferred embodiments and examples disclosed herein have been described for the purpose of illustration only and in a non-restrictive manner in any respect. The scope of the present invention is defined by the terms of the claims, rather than the embodiments described above, and is intended to include any modifications within the meaning and scope equivalent to the terms of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A light emitting device comprising:
a light source; and
a wavelength converter in which a phosphor containing particle is dispersed in a translucent medium, wherein the phosphor containing particle includes:
  a semiconductor nanoparticle phosphor; and
  a matrix including a constitutional unit derived from an ionic liquid, the semiconductor nanoparticle phosphor is dispersed in the matrix, and
the ionic liquid is 2-(methacryloyloxy)-ethyltrimethylammonium bis(trifluoromethanesulfonyl) imide or 1-(3-acryloyloxy-propyl)-3-methy limidazolium bis(trifluoromethane sulfonyl) imide.

2. The light emitting device according to claim 1, wherein the matrix includes a resin derived from the ionic liquid.

3. The light emitting device according to claim 2, wherein the ionic liquid has a polymerizable functional group.

4. The light emitting device according to claim 1, wherein the phosphor containing particle has a size within a range of about 100 nm to about 30 μm.

5. The light emitting device according to claim 1, wherein the semiconductor nanoparticle phosphor is of a single type.

6. The light emitting device according to claim 1, further comprising:
a red fluorescent light emitting semiconductor nanoparticle phosphor; and
a green fluorescent light emitting semiconductor nanoparticle phosphor.

7. The light emitting device according to claim 2, wherein the resin is crosslinked.

8. The light emitting device according to claim 1, wherein the phosphor containing particle has an outermost surface including a translucent coating layer.

9. The light emitting device according to claim 8, wherein a material included in the coating layer is an inorganic material having a band gap equal to or greater than 3.0 eV.

10. The light emitting device according to claim 1, further comprising a support that seals the matrix.

11. The light emitting device according to claim 10, wherein the support includes silica.

12. The light emitting device according to claim 10, wherein the semiconductor nanoparticle phosphor has a surface including a polar functional group.

13. The light emitting device according to claim 10, wherein the support has a hollow capsular structure including pores penetrating from a wall surface into an internal space.

14. The light emitting device according to claim 10, wherein the support has a globular structure including pores extending from a surface inwards.

15. The light emitting device according to claim 1, further comprising:
a phosphor containing particle in which a red fluorescent light emitting semiconductor nanoparticle phosphor is dispersed in a resin including a constitutional unit derived from an ionic liquid including a polymerizable functional group; and
a phosphor containing particle in which a green fluorescent light emitting semiconductor nanoparticle phosphor is dispersed in a resin including a constitutional unit derived from an ionic liquid including a polymerizable functional group.

16. The light emitting device according to claim 1, wherein a phosphor other than the semiconductor nanoparticle phosphor is further dispersed in the medium.

17. A light emitting device comprising:
a phosphor containing sheet in which a phosphor containing particle is dispersed in a sheet-like translucent medium; and
a light source that illuminates the phosphor containing sheet, wherein
the phosphor containing particle includes:
  a semiconductor nanoparticle phosphor; and
  a matrix including a constitutional unit derived from an ionic liquid,
the semiconductor nanoparticle phosphor is dispersed in the matrix, and
the ionic liquid is 2-(methacryloyloxy)-ethyltrimethylammonium bis(trifluoromethanesulfonyl) imide or 1-(3- acryloyloxy-propyl)-3-methy limidazolium bis(trifluoromethane sulfonyl) imide.

18. The light emitting device according to claim 17, wherein the matrix includes a resin derived from the ionic liquid.

19. The light emitting device according to claim 18, wherein the ionic liquid has a polymerizable functional group.

20. The light emitting device according to claim 17, wherein the phosphor containing particle has a size within a range of about 100 nm to about 30 μm.

21. The light emitting device according to claim 17, wherein the semiconductor nanoparticle phosphor is of a single type.

22. The light emitting device according to claim 17, further comprising:
  a red fluorescent light emitting semiconductor nanoparticle phosphor; and
  a green fluorescent light emitting semiconductor nanoparticle phosphor.

23. The light emitting device according to claim 18, wherein the resin is crosslinked.

24. The light emitting device according to claim 17, wherein the phosphor containing particle has an outermost surface including a translucent coating layer.

25. The light emitting device according to claim 24, wherein a material included in the coating layer is an inorganic material having a band gap equal to or greater than 3.0 eV.

26. The light emitting device according to claim 17, further comprising a support that seals the matrix.

27. The light emitting device according to claim 26, wherein the support includes silica.

28. The light emitting device according to claim 26, wherein the semiconductor nanoparticle phosphor has a surface including a polar functional group.

29. The light emitting device according to claim 26, wherein the support has a hollow capsular structure including pores penetrating from a wall surface into an internal space.

30. The light emitting device according to claim 26 wherein the support has a globular structure including pores extending from a surface inwards.

31. The light emitting device according to claim 17, further comprising:
  a phosphor containing particle in which a red fluorescent light emitting semiconductor nanoparticle phosphor is dispersed in a resin including a constitutional unit derived from an ionic liquid including a polymerizable functional group; and
  a phosphor containing particle in which a green fluorescent light emitting semiconductor nanoparticle phosphor is dispersed in a resin including a constitutional unit derived from an ionic liquid including a polymerizable functional group.

32. The light emitting device according to claim 17, wherein a phosphor other than the semiconductor nanoparticle phosphor is further dispersed in the medium.

* * * * *